US011029259B2

(12) United States Patent
Matejka et al.

(10) Patent No.: US 11,029,259 B2
(45) Date of Patent: Jun. 8, 2021

(54) DETECTION DEVICE FOR DETECTING A STRUCTURE ON AN AREA PORTION OF A LITHOGRAPHY MASK, AND APPARATUS COMPRISING A DETECTION DEVICE OF THIS TYPE

(71) Applicant: Carl Zeiss SMT GmbH, Oberkochen (DE)

(72) Inventors: Ulrich Matejka, Jena (DE); Sven Martin, Jena (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 0 days.

(21) Appl. No.: 16/707,391

(22) Filed: Dec. 9, 2019

(65) Prior Publication Data
US 2020/0191728 A1    Jun. 18, 2020

(30) Foreign Application Priority Data
Dec. 13, 2018  (DE) .......................... 102018221647.9

(51) Int. Cl.
*G01N 21/956* (2006.01)
*G01N 21/21* (2006.01)
(52) U.S. Cl.
CPC ........... *G01N 21/956* (2013.01); *G01N 21/21* (2013.01); *G01N 2021/95676* (2013.01)
(58) Field of Classification Search
CPC ................. G01N 21/956; G01N 21/21; G01N 2021/95676
See application file for complete search history.

(56) References Cited

U.S. PATENT DOCUMENTS 4,785,170 A * 11/1988 Witt .......................... G01J 1/16
250/226
6,483,589 B1   11/2002 Suzuki et al.
(Continued)

FOREIGN PATENT DOCUMENTS

DE          3835892       1/1990
DE       102004033602    2/2006
(Continued)

OTHER PUBLICATIONS

German Office Action for German Application No. DE 0 2018 221 647.9 dated Jul. 9, 2019 (with English Translation).
(Continued)

*Primary Examiner* — Jamil Ahmed
(74) *Attorney, Agent, or Firm* — Fish & Richardson P.C.

(57) ABSTRACT

A detection device serves for detecting a structure on an area portion of a lithography mask. The detection device has a first spatially resolving detector and also a further spatially resolving detector arranged separately therefrom. The first spatially resolving detector is embodied as a high-intensity (HI) detector and is arranged in an HI beam path of the detection light which emanates from the mask area portion. The further spatially resolving detector is embodied as a low-intensity (LI) detector and is arranged in an LI beam path of the detection light. The HI beam path on the one hand and the LI beam path on the other hand are embodied such that the HI detector is illuminated with a detection light intensity that is at least twice the magnitude of the detection light intensity with which the LI detector is illuminated. The two spatially resolving detectors are embodied for simultaneously detecting the detection light. The result is a detection device whose dynamic range is increased without limitations of a spatial resolution. Alternatively or additionally, the detection device, by way of the two spatially (Continued)

resolving detectors, can also be embodied for the polarization-resolved measurement of the detection light.

20 Claims, 13 Drawing Sheets

(56) References Cited

U.S. PATENT DOCUMENTS

| | | | | |
|---|---|---|---|---|
| 2006/0270077 | A1* | 11/2006 | Behfar | H01S 5/0262 |
| | | | | 438/24 |
| 2007/0121110 | A1* | 5/2007 | Kralik | G01J 3/06 |
| | | | | 356/318 |
| 2009/0274016 | A1* | 11/2009 | Katsuragawa | G02F 1/09 |
| | | | | 369/13.35 |
| 2012/0302862 | A1* | 11/2012 | Yun | A61B 5/0068 |
| | | | | 600/398 |
| 2015/0261098 | A1* | 9/2015 | Zhang | G03F 9/7046 |
| | | | | 355/71 |
| 2017/0131528 | A1 | 5/2017 | Ruoff et al. | |
| 2017/0132782 | A1* | 5/2017 | Matejka | G02B 17/0848 |

FOREIGN PATENT DOCUMENTS

| | | |
|---|---|---|
| DE | 102004033603 | 2/2006 |
| DE | 102005062237 | 7/2007 |
| DE | 102007009661 | 3/2008 |
| DE | 102007045891 | 4/2008 |
| DE | 102017115262 | 1/2019 |
| EP | 0 218 213 | 12/1991 |
| EP | 1 615 062 | 4/2008 |
| JP | 2015-184620 | 10/2015 |
| JP | 2016-105052 | 6/2016 |
| KR | 10-0731864 | 6/2007 |
| KR | 10-1882633 | 7/2018 |
| WO | WO 2016/012426 | 1/2016 |

OTHER PUBLICATIONS

Faulkner et al., "Movable Aperture Lensless Transmission Microscopy: A Novel Phase Retrieval Algorithm", *Physical Review Letters*, vol. 93, No. 2, pp. 023903-1-023903-4 (Jul. 2004).

Gardner et al., "High numerical aperture reflection mode coherent diffraction microscopy using off-axis apertured illumination", *Optics Express*, vol. 20, No. 17, pp. 19050-19059 (Aug. 13, 2012).

Maiden et al., "Further improvements to the ptychographical iterative engine", *Optica*, vol. 4, No. 7, pp. 736-745 (Jul. 2017).

Zhang et al., "Full field tabletop EUV coherent diffractive imaging in a transmission geometry", *Optics Express*, vol. 21, No. 19, pp. 21970-21980 (Sep. 23, 2013).

Korean Notice of Reasons for Rejection for Korean Application No. KR 10-2019-0164648, dated Nov. 30, 2020 (with English Translation).

* cited by examiner

DETECTION DEVICE FOR DETECTING A STRUCTURE ON AN AREA PORTION OF A LITHOGRAPHY MASK, AND APPARATUS COMPRISING A DETECTION DEVICE OF THIS TYPE

CROSS-REFERENCE TO RELATED APPLICATIONS

The present patent application claims the priority of the German patent application DE 10 2018 221 647.9, filed on Dec. 13, 2018, the content of which is incorporated by reference herein in its entirety.

TECHNICAL FIELD

The invention relates to a detection device for detecting a structure on an area portion of a lithography mask. The invention further relates to an apparatus for detecting a structure on an area portion of a lithography mask comprising a detection device of this type.

BACKGROUND

A method and respectively an apparatus for detecting a structure of a lithography mask are known from WO 2016/012426 A1. In the latter a 3D aerial image measurement takes place in the region around an image plane during the imaging of a lithography mask arranged in an object plane. In connection with detectors for polarization-resolved light measurement, in particular, reference is made to EP 1 615 062 B1, to DE 10 2007 045 891 A1, to DE 10 2017 115 262 A1, to DE 10 2004 033 603 A1, to DE 10 2004 033 602 A1, to DE 10 2005 062 237 A1 and to DE 10 2007 009 661 A1. EP 0 218 213 B1 discloses a method and an apparatus for the online measurement of transmission or reflection at moving objects. DE 38 35 892 C1 discloses a long-range laser interferometer.

SUMMARY

In a general aspect, the present invention enables development of a detection device of the type mentioned in the introduction in such a way that its dynamic range is increased without limitations of a spatial resolution.

This aspect is achieved according to the invention by use of a detection device for detecting a structure on an area portion of a lithography mask, in which the detection device includes a first spatially resolving detector, embodied as a high-intensity (HI) detector, arranged in an HI beam path of detection light which emanates from the mask area portion. The detection device includes a further spatially resolving detector, arranged separately from the first spatially resolving detector, embodied as a low-intensity (LI) detector, arranged in an LI beam path of the detection light. The HI beam path on the one hand and the LI beam path on the other hand are embodied such that the HI detector is illuminated with a detection light intensity that is at least twice the magnitude of the detection light intensity with which the LI detector is illuminated, in which the two spatially resolving detectors are embodied for simultaneously detecting the detection light.

It has been recognized according to the invention that a dynamic range of the detection device can be increased without limitations for the spatial resolution of the detector by the detection light being split into at least two beam paths having different detection light intensities, namely into at least one high-intensity beam path and into at least one low-intensity beam path. Associated HI/LI detectors are introduced into these beam paths. With an intensity ratio of the detection light between the HI beam path and the LI beam path of at least 3, the result is a dynamic range of the detection device that is advantageously improved for highly sensitive spatially resolved detection light detection. The detection device can be embodied such that an intensity ratio between the HI beam path and the LI beam path which is, e.g., at least 3 is higher than 4, is higher than 5, is higher than 6, is higher than 7, is higher than 8, is higher than 9, is higher than 10, is higher than 20, is higher than 30, is higher than 50 or is even higher. If the intensity ratio is n, then a dynamic range of the entire detection device is increased by the factor n by comparison with dynamic ranges of the individual HI/LI detectors. The dynamic range of the detector is the intensity of the brightest signal that can be measured without overload, divided by the noise level (generally given by electronic noise and dark noise). Use can also be made of more than two detectors having corresponding intensity gradation of the detection light intensities in the detection device, for example three detectors, four detectors, five detectors or even more detectors. In the case of three detectors, the intensity ratio between the beam paths can be for example 100 to 10 to 1. A total dynamic range is then increased by a factor of 100 in comparison with the individual dynamic ranges of the detectors. Alternatively, the intensity ratio between the beam paths in the case of three detectors can also be for example 900 to 30 to 1. In this case, the total dynamic range is increased by a factor of 900 in comparison with the individual dynamic ranges. With the use of four detectors in the detection device, the intensity ratio between the beam paths can be for example 8000 to 400 to 20 to 1. In this case, the total dynamic range is increased by a factor of 8000 in comparison with the individual dynamic ranges.

The detectors can be embodied in each case as a camera. The detectors can be embodied as a CMOS sensor or as a CCD sensor. The detectors can have a two-dimensional array of sensor pixels. The detection device can be embodied for detecting EUV detection light. In particular, the HI detector can be embodied such that channel crosstalk between the different pixels of the spatially resolved detector is avoided. Channel crosstalk of this type can occur for example as a result of the use of anti-blooming structures. A distortion calibration of the detection device can be effected by way of a measurement, for example of a pinhole array, arranged at the location of the area portion to be detected. The detection device can be embodied for use with detection light at extreme ultra-violet (EUV), deep UV (DUV), UV, visible light (VIS), near infrared (NIR) or IR wavelengths. EUV wavelengths can be in the range of between 5 nm and 30 nm, for example 13.5 nm.

The structure to be detected can be imaged onto detectors. The HI/LI beam paths can be fashioned such that an image of the structure to be detected in each case arises on the respective detectors. In so far as the detectors measure a far field diffraction structure of the structure to be detected, an imaging of this type is not required. Beam paths from the structure to be detected to the detectors can have different lengths, can have different scales and can also have different distortion values.

The detection device can have an arrangement in such a way that beam deflections in the HI beam path take place exclusively as a result of reflection. This avoids components that are transmissive for the detection light in the HI beam path. Detection light wavelengths for which there are no highly transmissive components can then be measured as well. The LI beam path can also be embodied such that no components that are transmissive for the detection light are arranged there. The HI beam path can be fashioned such that the HI detector represents the first optical component after the detection light has impinged on the area portion to be detected.

The spatially resolving detectors can have an arrangement in such a way that a reflection at the HI detector is part of the LI beam path. This results in particularly elegant routing of the LI beam path since a reflection at the HI detector that is regularly unavoidable anyway is used for said LI beam path. Alternatively, it is possible for the detectors to be arranged such that a reflection at the LI detector is part of the HI beam path. The arrangement and optionally a coating on the LI detector are then designed such that a large portion of the detection light is reflected at the LI detector and a small portion of the detection light in comparison therewith passes to the LI detector.

The HI detector can have a multilayer coating, in which the coating makes it possible to predefine the intensity of the reflected detection light in a targeted manner. This can be used for predefining a detection light intensity ratio between the HI beam path on the one hand and the LI beam path on the other hand.

The detection device can include a beam splitter for splitting a detection beam path emanating from the area portion into the HI beam path and the LI beam path. The beam splitter enables a precise predefinition of intensity ratios between the HI beam path and the LI beam path. The detection device can also have more than one beam splitter. The beam splitter can split the detection light into a reflected and into a transmitted reflection light beam path. Depending on the embodiment of the beam splitter, the reflected portion can represent the LI beam path and the transmitted portion can represent the HI beam path or, conversely, the reflected portion can represent the HI beam path and the transmitted portion can represent the LI beam path. In an application of the detection device for EUV detection light, the beam splitter can be produced as a membrane for example composed of zirconium or composed of a Zr compound, an Si compound, for example composed of SiN or composed of polysilicon. A membrane of this type can be embodied in a multi-layered fashion. An angle of incidence of the detection light on the beam splitter can be less than 20°.

The detection device can include an imaging optical unit for imaging the area portion, in which the beam splitter is arranged in an image plane of the imaging optical unit. In the case of such an arrangement, requirements in respect of a planarity of the beam splitter are low. The beam splitter in particular need not be embodied in a perfectly planar fashion and can have a, e.g. production-dictated topography. An imaging optical unit of the detection device can also be arranged between the beam splitter and at least one of the detectors.

The beam splitter can have a multilayer coating, which enables a precise predefinition in respect of the beam splitting properties of said beam splitter.

The beam splitter can have a diffractive structure, which makes it possible to use different orders of diffraction for splitting the detection light. It is possible to use two or more orders of diffraction for a subsequent detection. The diffractive structure can be part of an imaging optical unit of the detection device and can be applied for example on a mirror of the imaging optical unit. The mirror can be a plane mirror, a convex mirror or a concave mirror.

The beam splitter can be embodied as a grating. The grating embodiment of the beam splitter has proved worthwhile in practice. The beam splitter can in principle also be embodied as a more complexly structured diffractive optical element (DOE). The beam splitter can be embodied as a blazed grating.

The detection device can be configured such that an angle of reflection of a chief beam of the HI beam path after impinging on the beam splitter is less than 20°. Such an angle of reflection of the chief beam of the HI beam path firstly avoids excessively high imaging distortion, provided that the beam splitter is arranged in an image plane of the area portion to be detected and/or of the detector. Moreover, the high reflectivity of the beam splitter can be used when a small angle of reflection is chosen.

The detection device can have at least one mirror in the LI beam path, which makes it possible to arrange the LI detector spatially where this is advantageous for space reasons. The at least one mirror in the LI beam path can have a curved reflection surface. A curved mirror of this type additionally enables beam shaping of the detection light in the LI beam path. What can be achieved as a result is that the LI detector need not be larger than the HI detector. At least one plane mirror can also be arranged in the LI beam path.

In another general aspect, the present invention enables the development of a detection device of the type mentioned in the introduction in such a way that an information content of a measurement is increased.

This aspect is achieved according to the invention by use of a detection device for detecting a structure on an area portion of a lithography mask. The detection device includes a first spatially resolving detector, embodied as a p-polarization (pPol) detector, arranged in a pPol beam path of detection light which emanates from the mask area portion. The detection device includes a further spatially resolving detector, arranged separately from the first spatially resolving detector, embodied as an s-polarization (sPol) detector, arranged in an sPol beam path of the detection light. The two spatially resolving detectors are embodied for simultaneously detecting the detection light.

It has furthermore been recognized according to the invention that two spatially resolving detectors of the detection device can be used for the spatially resolved and simultaneously polarization-resolved measurement of the detection light emanating from the lithography mask area portion. In this case, it is possible for example to embody the sPol detector such that it measures s-polarized detection light and reflects p-polarized detection light towards the pPol detector. For this purpose, the first polarization-resolving detector in the beam path of the detection light can bear a diffractive structure embodied such that it transmits the polarization to be measured and reflects the other polarization direction, which can then be measured in the downstream detector.

The features of the detection devices explained above can also be present in combination. The HI detector can be embodied for example as a pPol detector. The LI detector can be embodied as an sPol detector. An opposite assignment of sPol/pPol to the HI/LI detector is also possible.

A polarization-resolving detector that can be used in association with a detection device described above is described in DE 10 2019 123 741.6, the content of which is incorporated by reference.

Instead of an s-polarization/p-polarization sensitivity of the two detectors, the polarization directions detected by way of the two detectors can also have other principal directions. The two polarizations that are detected by way of the detectors of the detection device can be linear polarization states or else other polarization states, for example elliptic or circular polarization states.

In another general aspect, an apparatus for detecting a structure on an area portion of a lithography mask includes a detection device described above, a light source for the detection light, and a mask holder for mounting the lithography mask.

The advantages of an apparatus described above correspond to those which have already been explained above with reference to the detection device according to the invention. The mask holder can be embodied in a tiltable fashion.

The light source can be embodied for example as arc lamp, laser (in particular excimer laser), synchrotron, HHG (High Harmonic Generation) or FEL (Free Electron Laser). Alternatively, other light sources in the EUV or in the DUV or in the UV or in the visible wavelength range are also possible. The structure detection of the lithography mask can be effected with an illumination light wavelength which corresponds to that which is likewise used during the lithographic projection exposure of the lithography mask for the production of semiconductor components. This is also referred to as actinic structure detection. However, this wavelength correspondence is not mandatory, and so the structure detection method can also be effected with a different illumination light wavelength compared with the projection exposure. A pellicle can be applied on the lithography mask in order to protect the lithography mask. The illumination/detection light wavelength used can be a wavelength for which the pellicle is transparent or has at least a high transmission of, for example, greater than 50%. The apparatus can comprise an interferometric measurement device for measuring a position of the illuminated portion on the lithography mask. The apparatus can comprise a structure generator for generating a structure of a beam of the illumination light. Such a structure can be selected so as to optimize a distribution of an illumination intensity over the recorded illumination image in particular for utilizing a usable dynamic range of the spatially resolving detector.

In another general aspect, a method for operating a detection device described above, or for operating an apparatus that includes the detection device, the light source for the detection light, and the mask holder for mounting the lithography mask described above, includes the following steps: recording images by simultaneously detecting the detection light by use of the detectors of the apparatus, and combining the recorded images to form an overall image.

Implementations can include the following feature. The combined overall image can have an increased dynamic range in comparison with the individual images recorded. In the case of the method described above, it is possible to build on experience already available in association with HDR (High Dynamic Range) cameras. The HI detector can be exposed for example such that pixels of the HI detector which were exposed with high intensity are overexposed. By contrast, pixels on the HI detector having low intensity can have a signal-to-noise ratio which is sufficient for the structure detection. Accordingly, a detection can be effected with the LI detector such that there pixels that are impinged on with comparatively high intensity in the LI beam path are exposed with a signal-to-noise ratio which is sufficient for the structure detection. Pixels of the LI detector which are exposed with comparatively low intensity can then have a possibly insufficient signal-to-noise ratio. Accordingly, what can also be achieved by the use of a further detector, embodied as a medium-intensity (MI) detector, is that there pixels impinged on with medium detection light intensity in comparison with the highest and the lowest detection light intensity are resolved with a sufficient signal-to-noise ratio.

The various HI/LI and optionally MI images can be combined in an electronic data processing apparatus or a computer. The pixels impinged on with high intensity in the detection light beam path are taken from the LI image and the associated intensity values are multiplied by the ratio of HI intensity/LI intensity. The pixels of medium intensity can be taken from the MI image and their intensity values can be multiplied by the ratio of MI intensity/LI intensity. The pixels having low intensity can be taken from the HI image. Which pixels are used from which image need not be defined in advance, but rather can be selected from the measured intensities after image recording. Such a selection or definition can be carried out automatically by an algorithm in the electronic data processing apparatus. The result is a composite image in which all pixels are measured with a sufficient signal-to-noise ratio but are not overloaded. Corresponding combination algorithms are known.

If the images detected on the spatially resolving detectors of the detection device have different distortions, a distortion correction can be carried out before the images are combined.

BRIEF DESCRIPTION OF DRAWINGS

Exemplary embodiments of the invention are explained in greater detail below with reference to the drawing. In said drawing.

DETAILED DESCRIPTION

Figure 1:
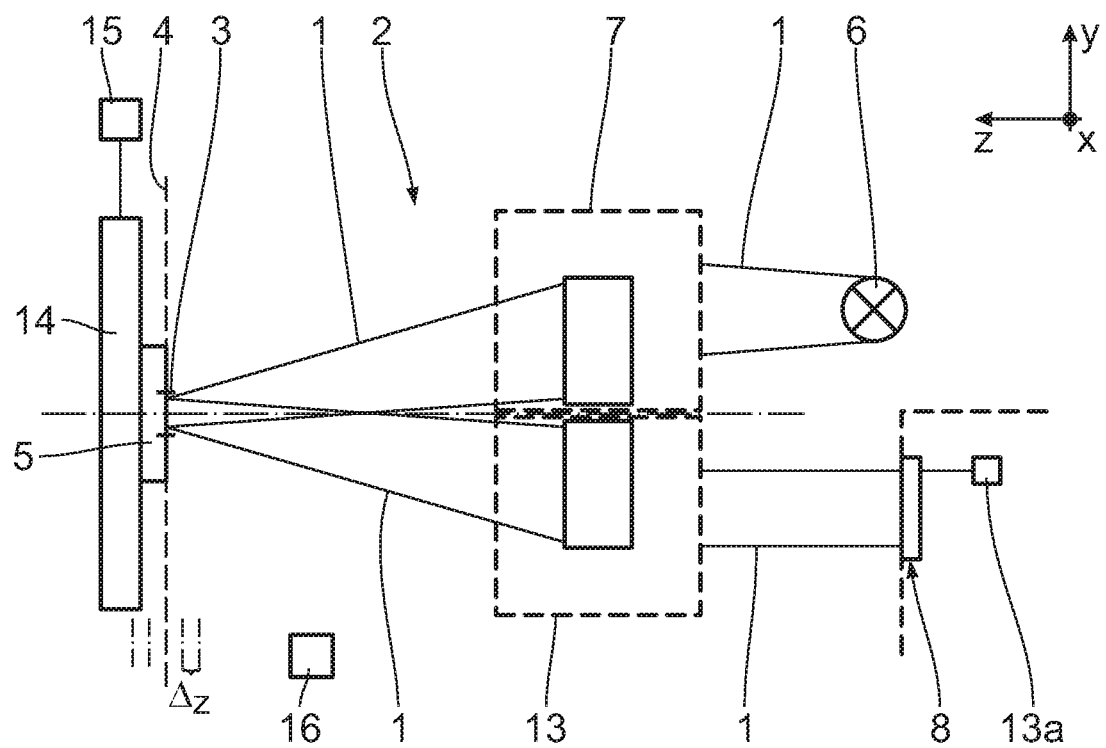
FIG. 1 shows highly schematically, in a plan view with the viewing direction perpendicular to a plane of incidence, an example of a measurement system for detecting a structure of a lithography mask by detection of at least one diffraction pattern, for measuring a reflective lithography mask.

FIG. 1 shows in a view corresponding to a meridional section a beam path of illumination light or imaging light 1 in a metrology system 2 for the examination of an object 5, arranged in an object field 3 in an object plane 4, in the form of a reticle or a lithography mask with the illumination light 1. The illumination light 1 can be EUV illumination light. The illumination light 1 is also referred to hereinafter as detection light.

The metrology system 2 is used for analysis of a diffraction pattern and is an apparatus for detecting a structure of the lithography mask which is in turn used during EUV projection exposure for the production of semiconductor components. The metrology system 2 detects the structure in the object field 3 on an area portion of the lithography mask. The mask structure detected by the metrology system 2 can then be used for example to determine effects of properties of the lithography mask on the optical imaging by projection optical units within a projection exposure apparatus.

The metrology system 2, in a similar manner to the system known from WO 2016/012426 A1, can be a system for mask qualification. In this case, the structure to be detected of the lithography mask 5 is the mask structure to be imaged itself.

Alternatively or additionally, the structure to be detected of the lithography mask 5 can be a position marker or a used structure on the lithography mask 5. The detection of such a position marker or a used structure can be used to detect or to measure an exact position of a plurality of position markers with respect to one another or of a plurality of used structures with respect to one another or used structure(s) relative to position marker(s) on the lithography mask 5. The metrology system 2 then finds application as a registration tool. One registration tool is known under the tradename PROVE. The measurement wavelength of the illumination light 1 can correspond to an actual projection exposure wavelength.

In order to facilitate the presentation of positional relationships, a Cartesian xyz-coordinate system is used hereinafter. In FIG. 1, the x-axis runs perpendicularly to the plane of the drawing and out of the latter. In FIG. 1, the y-axis runs upwards. In FIG. 1, the z-axis runs towards the left.

The object plane 4 is parallel to the xy-plane.

The illumination light 1 is reflected and diffracted at the object 5. A plane of incidence of the illumination light 1 lies parallel to the yz-plane.

Depending on the embodiment of the metrology system 2, the latter can be used for a reflective or for a transmissive object 5. One example of a transmissive object is a phase mask.

The EUV illumination light 1 is generated by a light source 6. This can be a light source in the visible range, in the near, middle or far UV range or in the EUV range. The light source 6 can be a laser plasma source (LPP; laser produced plasma) or a discharge source (DPP; discharge produced plasma). It is also possible to use a synchrotron-based light source, or a Free Electron Laser (FEL). The light source 6 can comprise a device for generating high harmonics of a fundamental wavelength (High Harmonic Generation, HHG). A used wavelength of the EUV light source can be, e.g. in the range of between 5 nm and 30 nm. However, longer or shorter wavelengths are also possible. In principle, in the case of a variant of the metrology system 2, a light source for another used light wavelength can also be used instead of the light source 6, for example a light source for a DUV used wavelength of 193 nm.

An illumination optical unit 7 of the metrology system 2 is arranged between the light source 6 and the object 5. The illumination optical unit 7 serves for the illumination of the object 5 to be examined with a defined illumination intensity distribution over the object field 3 and at the same time with a defined illumination angle or a defined illumination angle distribution with which the field points of the object field 3 are illuminated. With the lithography mask 5 arranged in the object field 3, the object field 3 simultaneously constitutes an illuminated portion of the lithography mask 5.

After reflection at the object 5 or transmission through the object 5, the diffracted illumination or imaging light 1 impinges on a spatially resolving detection unit or detection device 8 of the metrology system 2.

Figure 2:
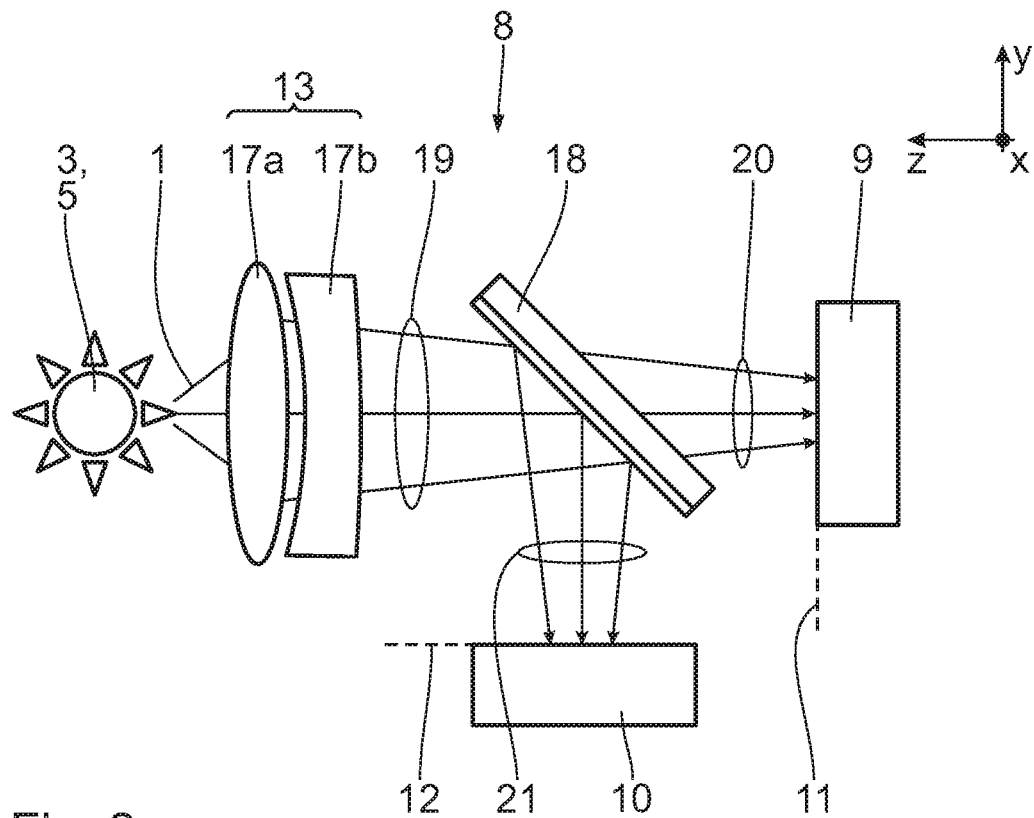
FIG. 2 shows one embodiment of an example of a detection device for use in a measurement system according to FIG. 1.

Details of one embodiment of the detection device 8 are illustrated in FIG. 2. Spatially resolving detectors 9, 10 of the detection device 8 are embodied e.g. as CCD or CMOS detector. A spatial resolution of the sensor or detector 9, 10 arises by way of a corresponding pixel division. The spatially resolving detector 9, 10 of the detection device 8 can be delimited in a square or rectangular fashion in a respective detection plane 11, 12. The detection plane 11 of the detector 9 extends parallel to the xy-plane. The detection plane 12 of the detector 10 extends parallel to the xz-plane. The detection device 8 detects a diffraction intensity during the recording of the diffraction pattern of the lithography mask 5. As indicated in FIG. 1, a deflecting and/or beam-influencing optical unit 13 can be arranged between the object 5 and the detection device 8. This is not mandatory, however. In other words, it is also possible for no optical element and/or no beam-influencing element at all to be arranged between the object 5 and the detection device 8.

The detection device 8 is signal-connected to a digital image processing device 13*a*.

The object 5 is carried by a mask or object holder 14. The latter can be displaced by way of a displacement drive 15 on the one hand parallel to the xy-plane and on the other hand perpendicularly to this plane, that is to say in the z-direction, e.g. in $\Delta_z$ increments. The mask holder 14 is displaceable for changing between portions to be illuminated of the lithography mask 5. The mask holder 14 can additionally be embodied as tiltable about the x-axis and/or about the y-axis. The displacement drive 15, as also the entire operation of the metrology system 2, is controlled by a central control device 16, which, in a way that is not illustrated in more specific detail, is signal-connected to the components to be controlled.

In the case of the embodiment of the detection device 8 according to FIG. 2, the optical unit 13 between the object 5 and the detectors 9, 10 is embodied for example as a combination of two lens elements 17*a*, 17*b*. The optical unit 13 can be an imaging optical unit.

A beam splitter 18 is arranged in the beam path of the detection light 1 between the optical unit 13 and the detector 9. Said beam splitter serves for splitting a detection light beam path 19 emanating from the area portion 3 into a high-intensity (HI) beam path 20 and a low-intensity (LI) beam path 21. In the case of the embodiment according to FIG. 2, the HI beam path 20 is transmitted by the beam splitter 18 and the LI beam path 21 is reflected by the beam splitter 18. A ratio of transmission to reflection is 90/1 in the case of the beam splitter 18. Other embodiments of the beam splitter 18 having ratios of transmission to reflection that deviate therefrom are also possible, resulting in an intensity ratio between an intensity of the detection light 1 in the HI beam path 20 and an intensity of the detection light 1 in the LI beam path 21 of at least 3. Examples of such ratios of transmission to reflection of the beam splitter 18 can be 99.9/0.1, 99/1, 97/3, 95/5, 85/15, 80/20, 3/1, or, provided that the reflected beam path is the HI beam path and the transmitted beam path is the LI beam path, 1/3, 20/80, 15/85, 10/90, 5/95, 3/97, 1/99 or 0.1/99.9. A ratio of transmission to reflection can thus lie in the value ranges of between $10^5$ and 2 or between 1/2 and $1/10^5$. Accordingly, the intensity ratio between the intensity in the HI beam path 20 and the intensity in the LI beam path 21 can lie in the range of between 2 and $10^5$, for example can be 3, 4, 5, 7.5, 10, 20, 50, 100, 1000, or even higher.

In the case of the embodiment of the beam splitter according to FIG. 2, an angle of incidence of the detection light beam path 19 on the beam splitter 18 is approximately 45°. Depending on the embodiment of the beam splitter 18, said angle of incidence can be in the range of between 5° and 80°, for example 10°, 22.5°, 45°, 60° or 70°.

The beam splitter 18 can have a multilayer coating for predefining the transmission/reflection ratio. Alternatively or additionally, the beam splitter can have a diffractive structure.

The detector 9 situated in the HI beam path 20 is referred to hereinafter as HI detector. The other detector 10, arranged in the LI beam path 21, is referred to hereinafter as LI detector. The HI detector 9 can be embodied structurally identically to the LI detector 10. The detection light beam path comprising the HI beam path 20 and the LI beam path 21 is configured such that the HI detector 9 is illuminated with a higher intensity than the LI detector 10.

Alternatively or additionally, the detector 9 can be a polarization-resolving detector, that is to say a detector for detecting p-polarized light (light having a polarization direction parallel to the yz-plane) or for detecting s-polarized light (light having a polarization vector perpendicular to the yz-plane, that is to say along the x-direction). Accordingly, the detector 10 can also be a polarization-resolving detector, for example a detector for s-polarization or a detector for p-polarization. Preferably, the two detectors 9, 10 then each measure one of the two variants "s-polarization" and "p-polarization". The detectors 9, 10 of the other exemplary embodiments described here can also accordingly be in each case a polarization-resolving detector. The detection device 8 can thus be used for both spatially resolving and polarization-resolving detection of the detection light 1 emanating from the area portion 3 of the lithography mask 5.

The two detectors 9, 10 are embodied for the simultaneous detection of the detection light 1.

In so far as transmissive components are used in the detection device 8, they can be employed for use with detection light 1 having wavelengths that are transmitted by these components. In the case of the embodiment according to FIG. 2, it is possible to use for example detection light 1 in the wavelength range of between 193 nm and the near infrared, in particular in the UV or VIS range.

The HI detector 9 is embodied so as to avoid crosstalk between the individual channels of this spatially resolved detector 9. This can be achieved by anti-blooming structures.

A distortion calibration of the detection device 8 can be carried out by way of a measurement of a pinhole array at the location of the object field 3.

Figure 18:
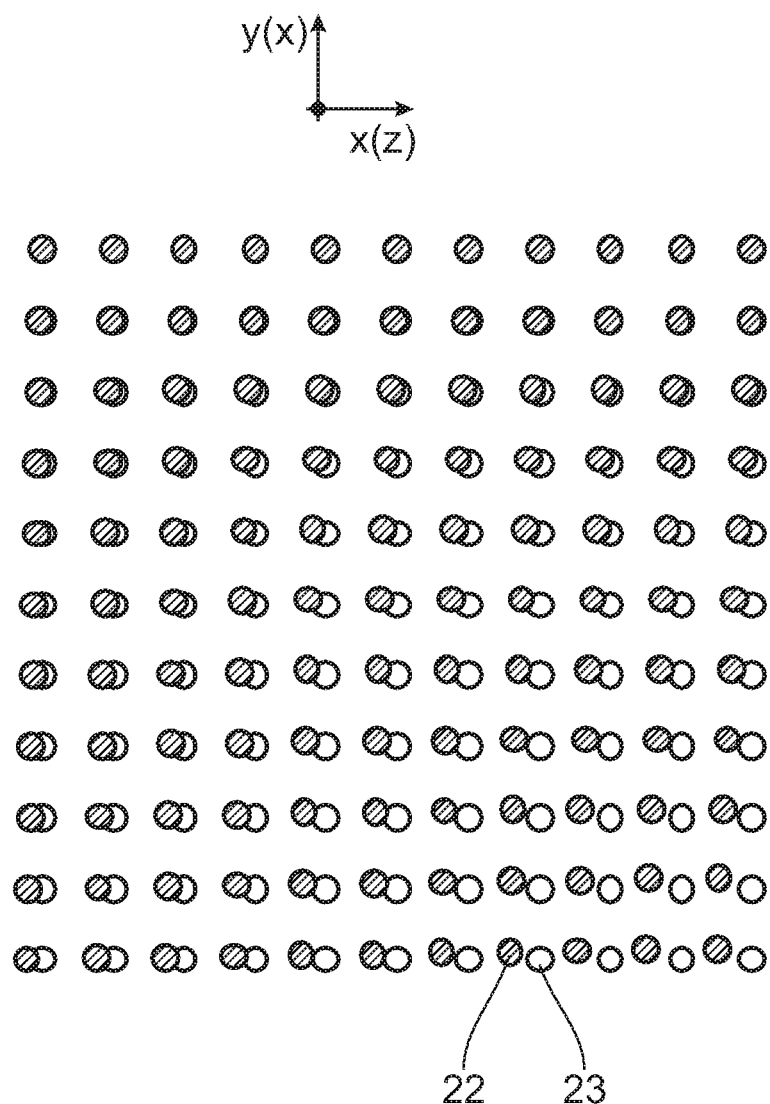
FIG. 18 shows a diffraction structure array that was recorded by a spatially resolving detector of one of the detection device embodiments, together with a Cartesian equidistant comparison grid that can be used for the distortion calibration of the spatially resolving detector.

FIG. 18 shows the comparison of a measurement of measured points 22 (hatched circles in FIG. 18) of such a pinhole array in the detection planes 11 and 12, respectively, with the actual, equidistant array having array points 23 (blank circles in FIG. 18). The pinhole array shown in FIG. 18 is merely an example, other pinhole arrays can also be used. The distortion, that is to say a distance between the measured point 22 and its assigned array point 23, increases with decreasing y-coordinate (xy-detection plane 11) and respectively with decreasing x-coordinate (xz-detection plane 12) and with increasing x-coordinate and respectively with increasing z-coordinate. Accordingly, in FIG. 18 this distance is the greatest for the points 22, 23 arranged at the bottom right, and is hardly measurable at the top left. From the coordinate distances between the measured points 22 and the respectively assigned array points 23, it is possible to generate coordinate-dependent correction values that are used for imaging correction in the context of the distortion calibration of the detectors 9, 10.

Figure 3:
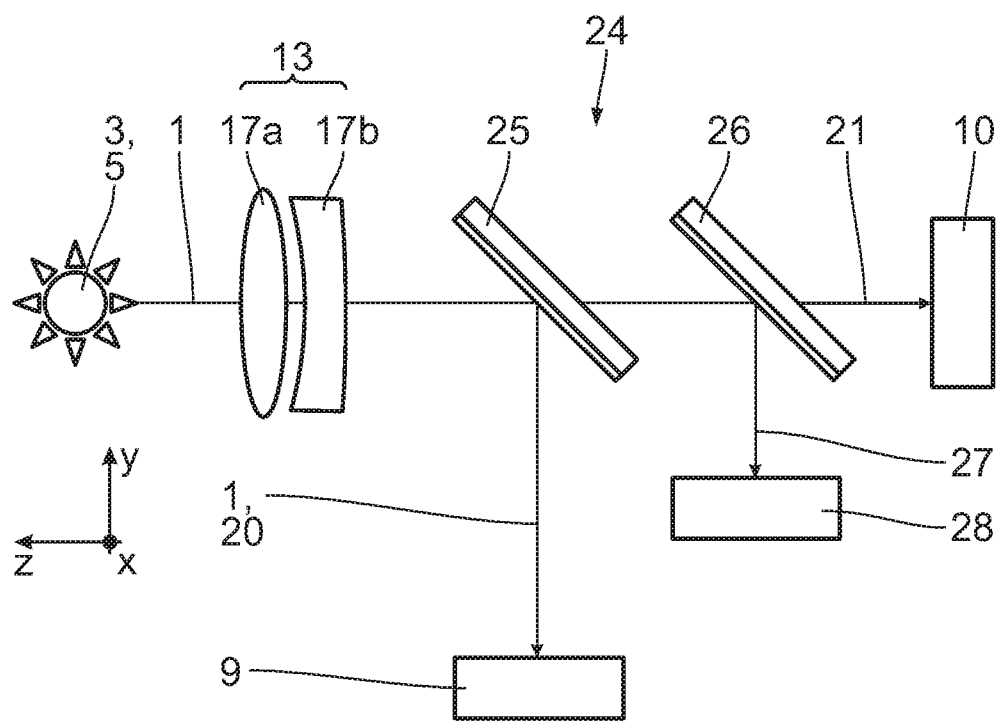
FIGS. 3 to 17 show further embodiments of examples of detection devices which can be used instead of the embodiment according to FIG. 2 in the measurement system according to FIG. 1.

With reference to FIG. 3, a description is given below of a further embodiment of a detection device 24, which can be used instead of the detection device 8. Components and functions corresponding to those which have already been explained above with reference to the detection device according to FIGS. 1 and 2 bear the same reference signs and will not be discussed again in detail.

After passing through the optical unit 13, the detection light 1 in the case of the detection device 24 firstly impinges on a first beam splitter 25, which reflects 90% of the detection light 1 (HI beam path 20) and transmits 10% thereof. This transmitted portion is split into a reflected medium-intensity (MI) beam path 27 and the low-intensity beam path 21 by a further beam splitter 26 having an identical reflection/transmission ratio of 9/1. An intensity ratio of the detection light 1 in the three beam paths 20, 27, 21, that is to say the HI/MI/LI ratio, is 90/9/1.

In the case of the detection device 24, the two beam splitters 25, 26 both reflect in the same direction (−y).

In the case of the detection device 24, the HI detector 9 is arranged in the beam path reflected by the beam splitter 25. The LI detector 10 is arranged in the LI beam path 21 transmitted by both beam splitters 25, 26. A further medium-intensity (MI) detector 28 is arranged in the MI beam path 27.

The detection light beam path is embodied such that the MI detector 28 is illuminated at least with 1.5 times the intensity compared with the LI detector 10. For a given HI/LI intensity ratio, the MI intensity can be between these HI and LI values, such that the following holds true for example for the intensity ratios: HI/MI=MI/LI.

Figure 4:
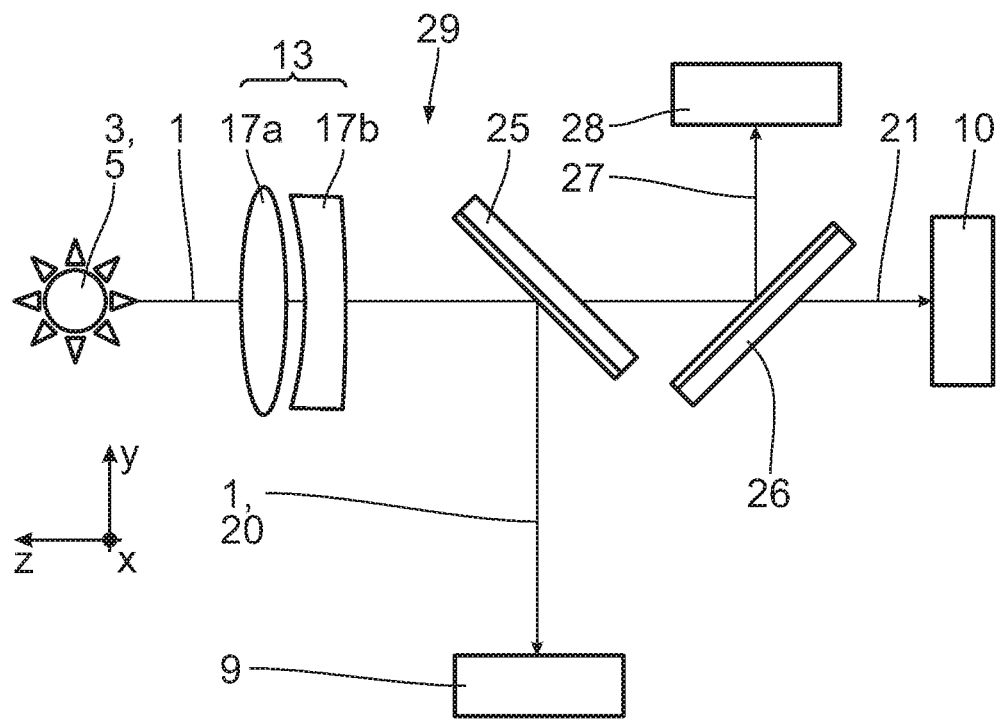

With reference to FIG. 4, a description is given below of a further embodiment of a detection device 29, which can be used instead of the detection device 8. Components and functions corresponding to those which have been explained above with reference to FIGS. 1 to 3 bear the same reference signs and will not be discussed again in detail.

In contrast to the detection device 24, the second beam splitter 26 in the case of the detection device 29 reflects the MI beam path 27 in the positive y-direction, that is to say in the opposite direction to the reflection direction of the first beam splitter 25.

Figure 5:
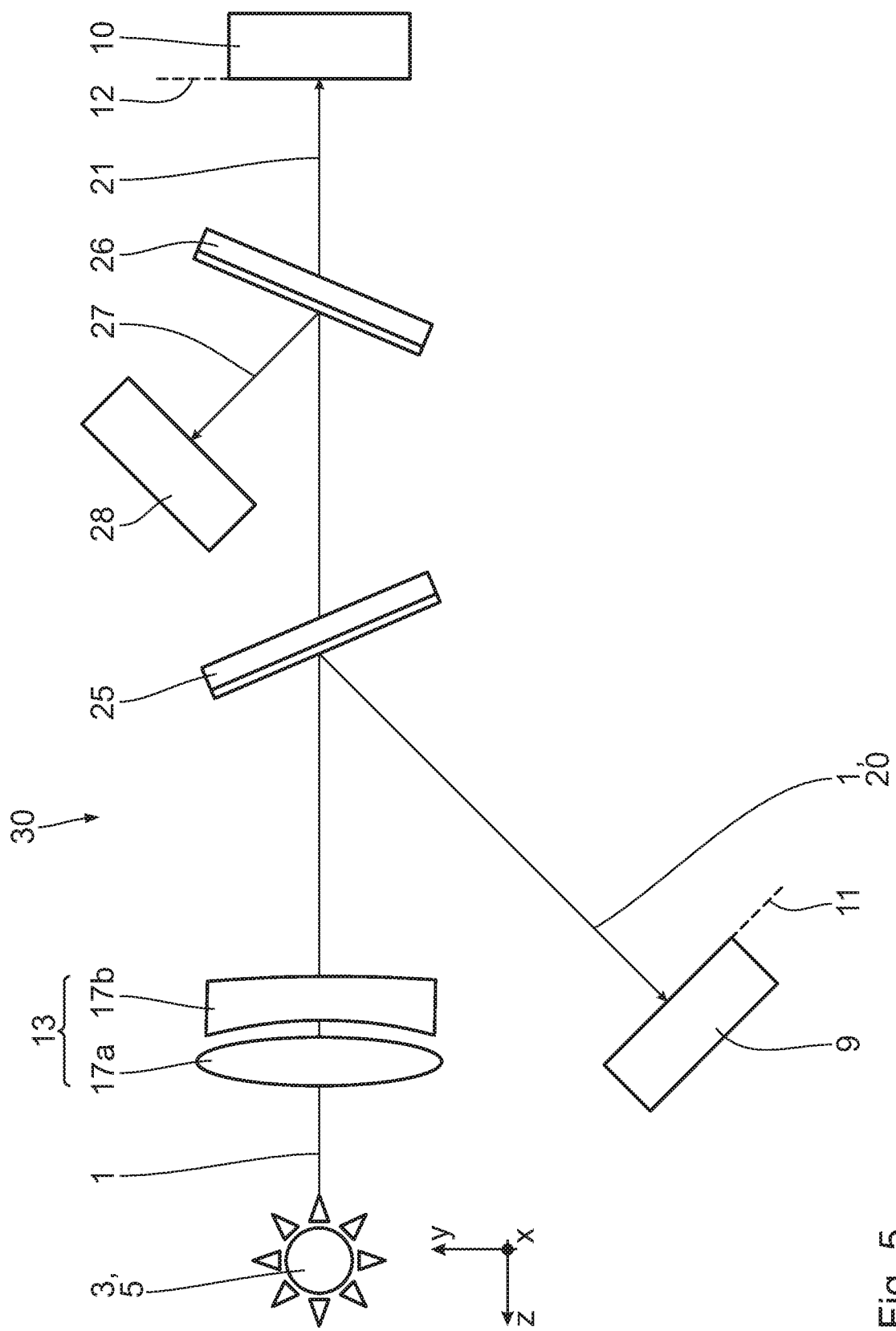

With reference to FIG. 5, a description is given below of a further embodiment of a detection device 30, which can be used instead of the detection device 8. Components and functions corresponding to those which have been explained above with reference to FIGS. 1 to 4 bear the same reference signs and will not be discussed again in detail.

In the case of the detection device 30, which otherwise corresponds to the detection device 29, the angles of incidence of the detection light 1 on the beam splitters 25, 26 are not 45°, but rather 22.5°, thus resulting in a total deflection of the HI beam path 20, on the one hand, and of the MI beam path 27, on the other hand, of 45° towards the detectors 9 and 28.

Figure 6:
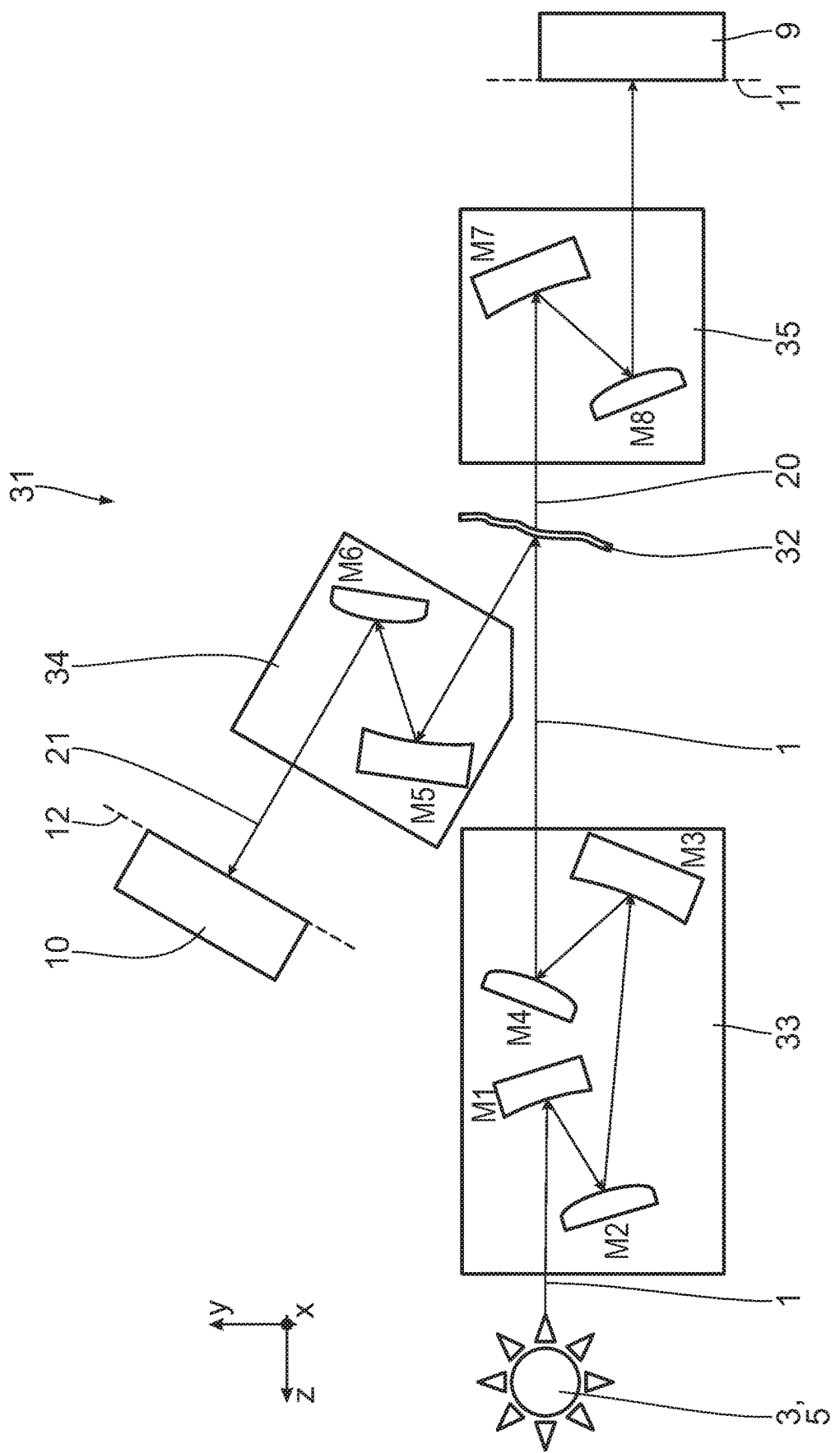

With reference to FIG. 6, a description is given below of a further embodiment of a detection device 31, which can be used instead of the detection device 8. Components and functions corresponding to those which have been explained above with reference to FIGS. 1 to 5 and in particular with reference to FIG. 2 bear the same reference signs and will not be discussed again in detail.

A beam splitter 32 of the detection device 31, which beam splitter in principle has the function of the beam splitter 18 of the embodiment according to FIG. 2, is embodied as a thin membrane in the case of the detection device 31, said membrane allowing beam splitting of EUV detection light 1, for example into a wavelength range of the detection light 1 of between 5 nm and 30 nm. A ratio of transmission to reflection is 80/1 in the case of the beam splitter 32. 19% of the incident EUV detection light 1 is thus neither reflected into the LI beam path 21 nor transmitted into the HI beam path 20, but rather is scattered or absorbed by the beam splitter 32.

The beam splitter 32 can be a thin membrane composed of zirconium (Zr) or composed of a Zr compound. The beam splitter 32 can also be composed of silicon, SiN, polysilicon or some other silicon compound. The beam splitter 32 can be embodied in a multi-layered fashion.

In the beam path between the object field 3 and the beam splitter 32, the detection device 31 has a first imaging optical unit 33. The latter is embodied as a mirror optical unit, that is to say is catoptric. The imaging optical unit 33 has four mirrors M1 to M4, which are numbered in the order in which they are arranged in the detection light beam path.

An angle of incidence of the detection light 1 on the beam splitter 32 in the case of the detection device 31 is approximately 15°, that is to say is less than 20°.

Between the beam splitter 32 and the LI detector 10, a further imaging optical unit 34 is arranged in the LI beam path 21. Said further imaging optical unit serves for imaging that portion of the beam splitter 32 on which the detection light 1 impinges into the detection plane 12 of the LI detector 10. The imaging optical unit 34 is likewise embodied in catoptric fashion and has two mirrors M5, M6.

Between the beam splitter 32 and the HI detector 9, a further imaging optical unit 35 is arranged in the HI beam path 20. Said further imaging optical unit in turn serves for imaging that portion of the beam splitter 32 on which the detection light 1 impinges onto the detection plane 11 of the HI detector 9. The imaging optical unit 35 is in turn catoptric and has two mirrors M7 and M8.

Imaging factors of the imaging optical units 33, 34, 35 can be in the region of 1, can be greater than 1 or can be less than 1.

The detection light 1 used in the case of the detection device 31 can be EUV detection light. That area portion of the beam splitter 32 on which the detection light 1 impinges need not be made planar, and in particular need not be made perfectly planar, in order to ensure a measurement with the aid of the detection device 31.

Figure 7:
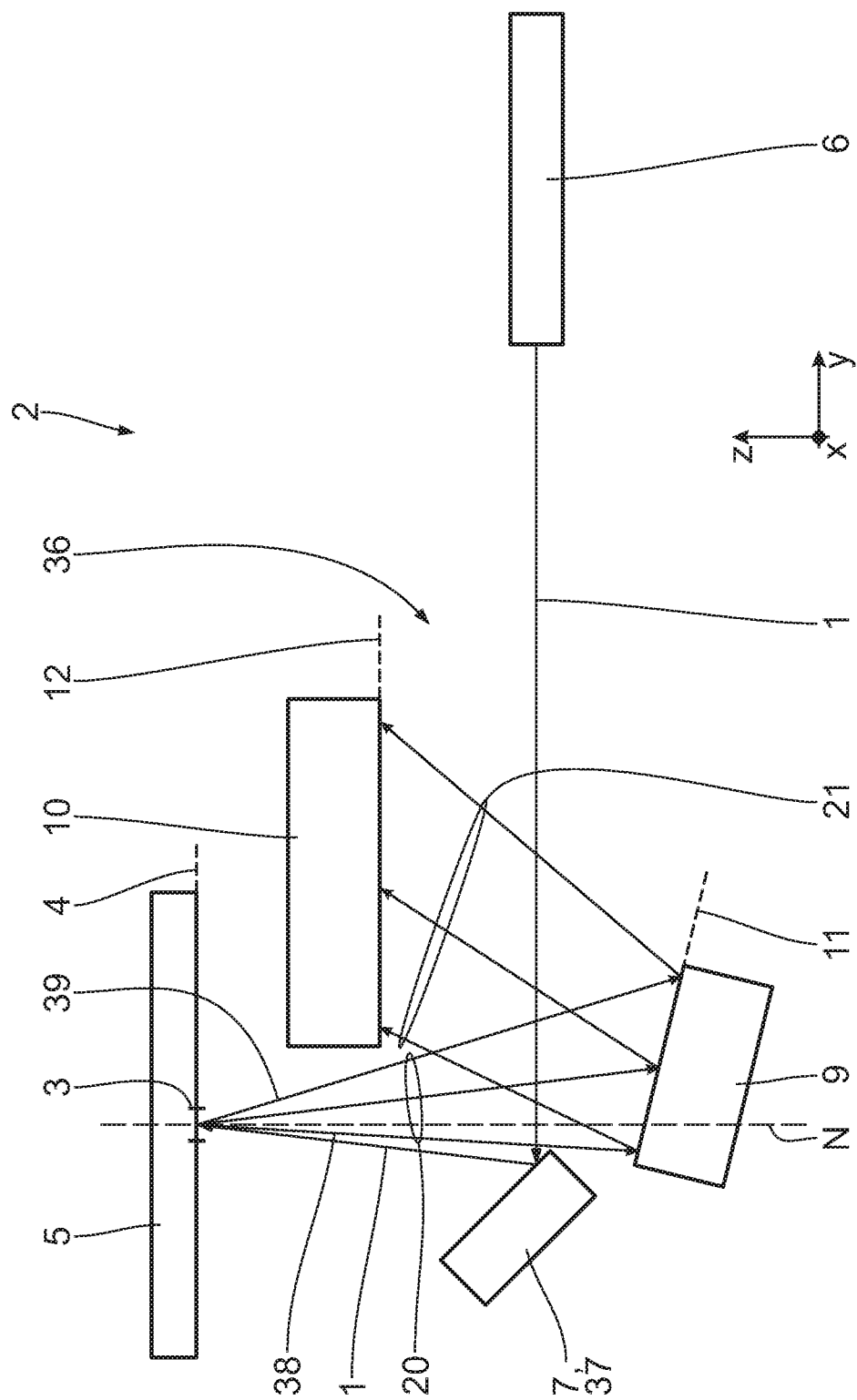

With reference to FIG. 7, a description is given below of a further embodiment of a metrology system 2 with a further embodiment of a detection device 36, which can be used instead of the detection devices described above. Components and functions which have already been explained above with reference to FIGS. 1 to 6 bear the same reference signs and will not be discussed again in detail.

In the case of the metrology system 2 according to FIG. 7, an HHG light source 6 serves for generating the EUV detection light 1. The detection light 1 emitted by said light source 6 is reflected via a plane mirror 37, belonging to the illumination optical unit 7, towards the object field 3. An angle of incidence of the detection light 1 on the object field 3 is approximately 6°.

Firstly the HI detector 9 is arranged in the beam path of the diffracted detection light 1 emanating from the object field 3. Said HI detector constitutes the first optical component in the detection light beam path downstream of the object field 3. This detection light beam path is thus simultaneously the HI beam path 20. In the yz-plane, that is to say the plane of the drawing in FIG. 7, the HI beam path 20 covers angles of reflection in a range of approximately 20° and extends between a left-hand marginal beam 38 in FIG. 7 with an angle of reflection from the object field 3 of 4°, passing, as viewed from a normal N to the object field 3, in the same half-space as the incident detection light 1, through to a right-hand marginal beam 39 in FIG. 7, which passes in the other half-space and has an angle of reflection of 16° with respect to the normal N. The HI beam path 20 thus runs spatially past the plane mirror 37.

A small proportion of the detection light 1 incident on the HI detector 9, namely approximately 1% of the incident detection light in the HI beam path 20, is reflected by the HI detector 9 towards the LI detector 10, that is to say into the LI beam path 21.

The LI detector 10 is arranged alongside the HI beam path 20. Between the light source 6 and the plane mirror 37, the emitted detection light 1 passes through between the two detectors 9 and 10.

In the HI beam path 20, no beam diffraction at all of the detection light 1 emanating from the object field 3 takes place in the case of the detection device 36.

Beam deflections in the LI beam path 21 take place exclusively as a result of reflection, namely as a result of the reflection at the HI detector 9.

No components which are transmissive to the detection light 1 are present in the HI beam path 20. This equally applies to the LI beam path 21.

An angle of incidence of the detection light 1 on the HI detector 9 is approximately 20°. The detection plane 12 of the LI detector 10 lies parallel to the xy-plane in the case of the detection device 36.

Figure 8A:
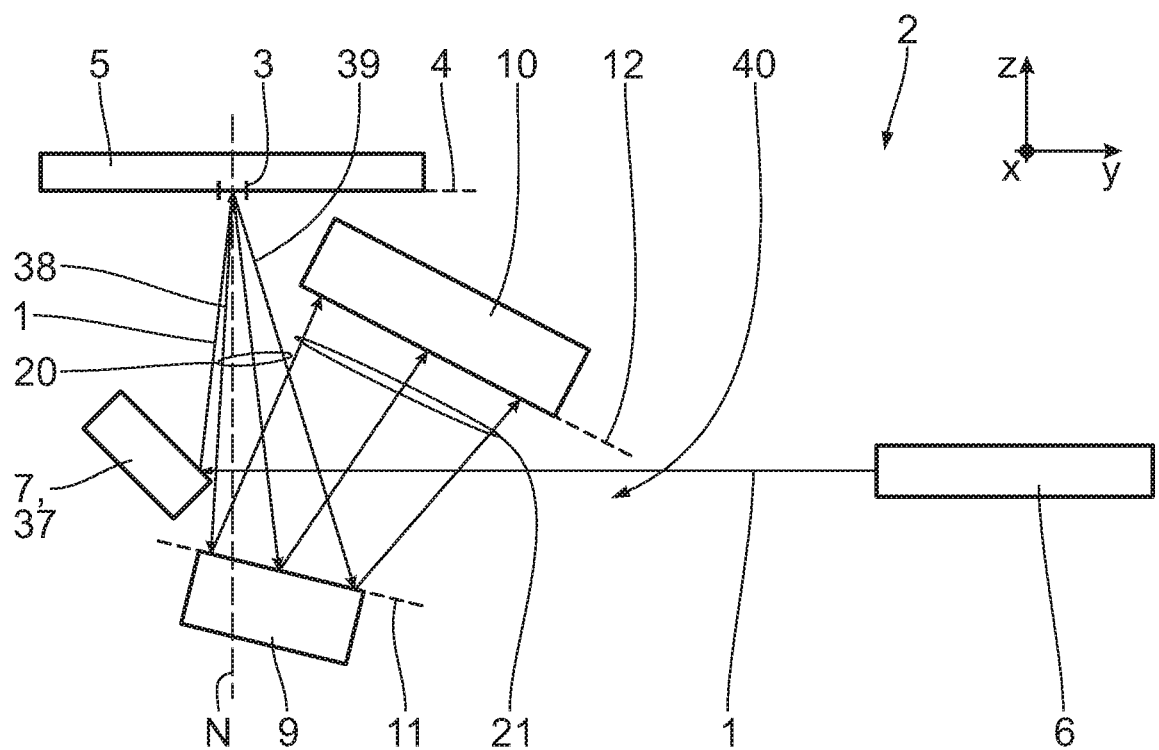

With reference to FIG. 8A, a description is given below of a further embodiment of a detection device 40, which can be used instead of the detection device 36 in the metrology system 2 according to FIG. 7. Components and functions corresponding to those which have already been explained above with reference to FIGS. 1 to 7, and in particular with reference to FIG. 7, bear the same reference signs and will not be discussed again in detail.

In the case of the detection device 40, the LI detector 10 is arranged such that the detection plane 12 is approximately perpendicular to the LI beam path 21. That can increase a detection efficiency of the LI detector 10.

Alternatively or additionally, the detector 9 can also be embodied as an sPol detector for detecting s-polarised portions of the detection light 1. For this purpose, the detector 9 can have a diffractive structure (not illustrated in more specific detail), which transmits the s-polarisation to the detector 9 and reflects the p-polarisation towards the detector 10. The detector 10 is then a pPol detector.

Figure 8B:
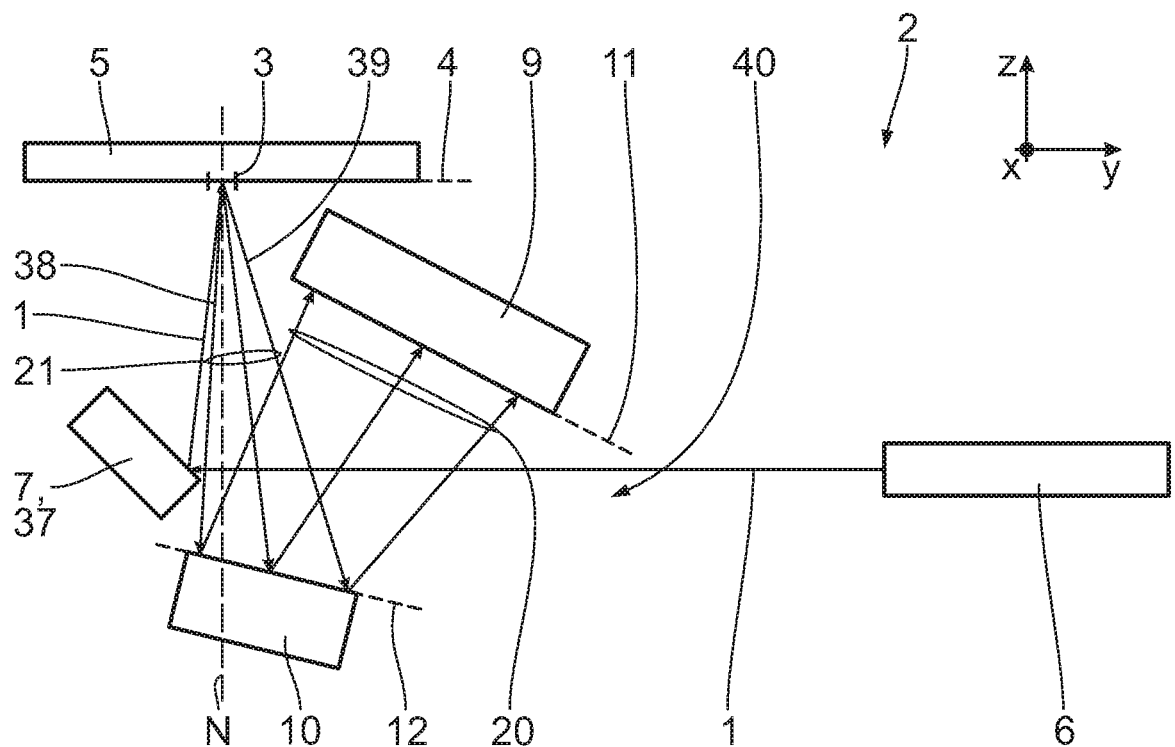

The detection light beam path can also be fashioned such that the HI detector 9 and the LI detector 10 change places in the case of the arrangement according to FIG. 8A. This is illustrated in FIG. 8B. A reflection coating on an LI detector 10 is then embodied such that for example 50% of the intensity of the detection light 1 is reflected by this coating of the LI detector 10. The reflected detection light 1 then passes in the HI beam path 20 and impinges on the HI detector 9. The detection light 1 transmitted by the coating to the LI detector 10 passes in the LI beam path (not explicitly illustrated in FIG. 8B) and impinges on the detector area of the LI detector 10. Approximately 1% of the detection light 1 is transmitted by said coating to the LI detector 10.

Figure 9:
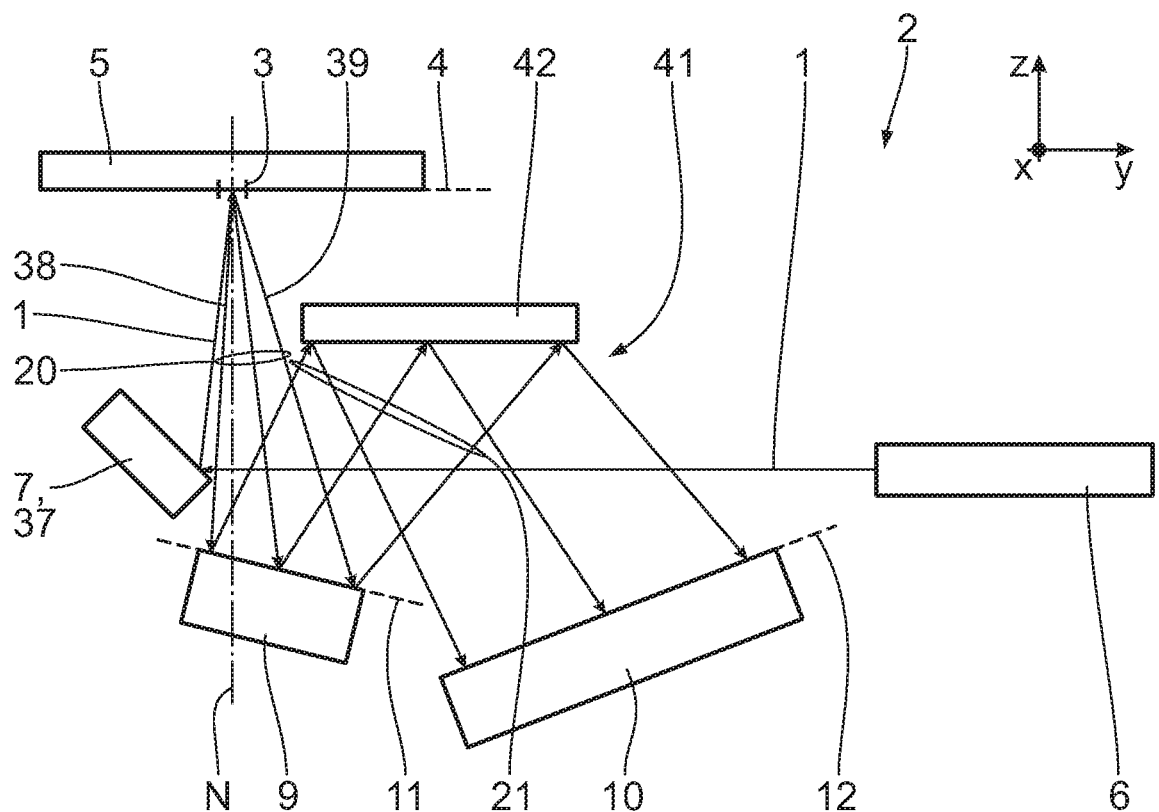

With reference to FIG. 9, a description is given below of a further embodiment of a detection device 41, which can be used instead of the detection device 36 in the metrology system 2 according to FIG. 7. Components and functions corresponding to those which have already been explained above with reference to FIGS. 1 to 8, and in particular with reference to FIGS. 7 and 8, bear the same reference signs and will not be discussed again in detail.

In the case of the detection device 41, firstly a plane mirror 42 is arranged in the LI beam path 21 downstream of the HI detector 9, said plane mirror deflecting the detection light 1 in the LI beam path 21 towards the LI detector 10. An angle of incidence of the detection light 1 on the plane mirror 42 can be in the range of between 10° and 40°. Possible structural space conflicts between, in particular, electronic components of the detector 10 and the lithography mask 5 can be avoided in the case of the arrangement according to FIG. 9.

A reflection plane of the plane mirror 42 lies parallel to the xy-plane.

Figure 10:
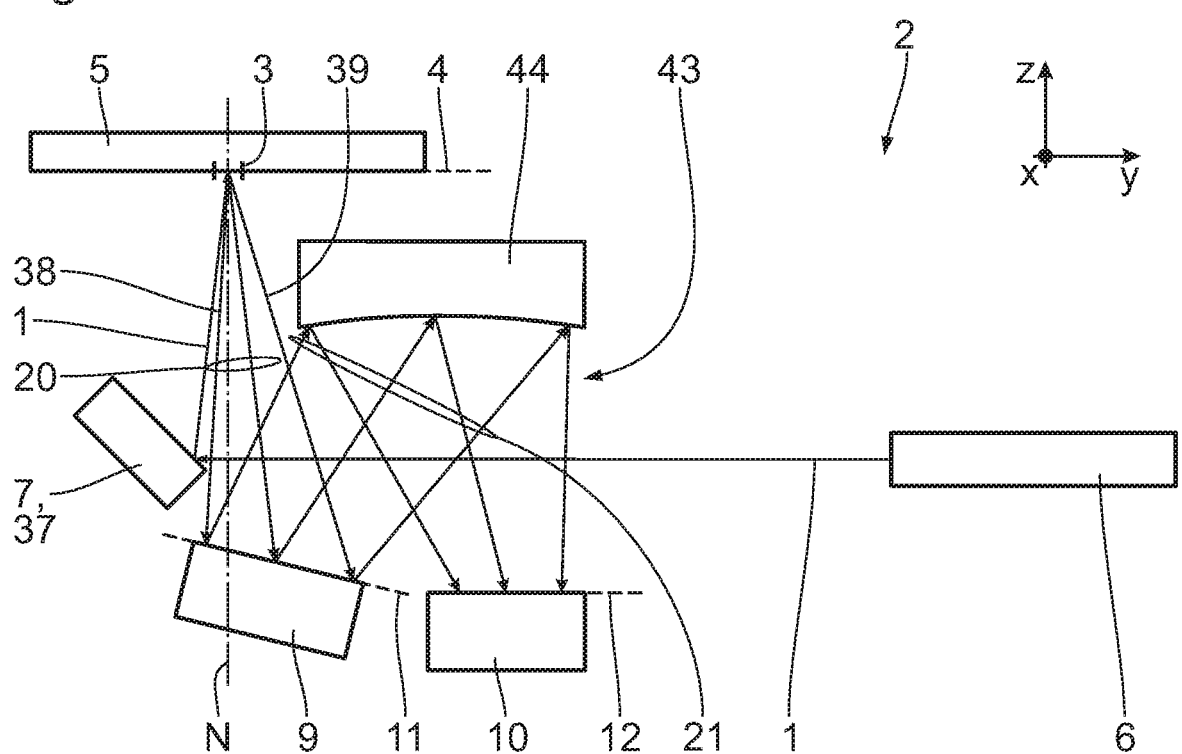

With reference to FIG. 10, a description is given below of a further embodiment of a detection device 43, which can be used instead of the detection device 8. Components and functions corresponding to those which have already been explained above with reference to FIGS. 1 to 9, and in particular with reference to FIGS. 7 to 9, bear the same reference signs and will not be discussed again in detail.

Instead of the plane mirror 42 in the case of the detection device 41, in the case of the detection device 43 a curved mirror in the form of a concave mirror 44 is arranged in the LI beam path 21. Said mirror converts the LI beam path 21 incident divergently on the reflection surface of this concave mirror 44 into a beam path extending convergently towards the LI detector.

In the case of the detection device 41, the detection light 1 emitted by the light source 6 passes between the plane mirror 42, on the one hand, and the two detectors 9, 10, on the other hand. The plane mirror 42 is arranged between the detection light beam emitted by the light source 6, on the one hand, and the object plane 4, on the other hand.

In the case of such an arrangement, the detectors 9 and 10 can be embodied with for example comparable or exactly the same size. The two detectors 9 and 10 can be embodied identically, for example. In principle, different portions of one and the same detector can be used as detectors 9 and 10.

Figure 11:
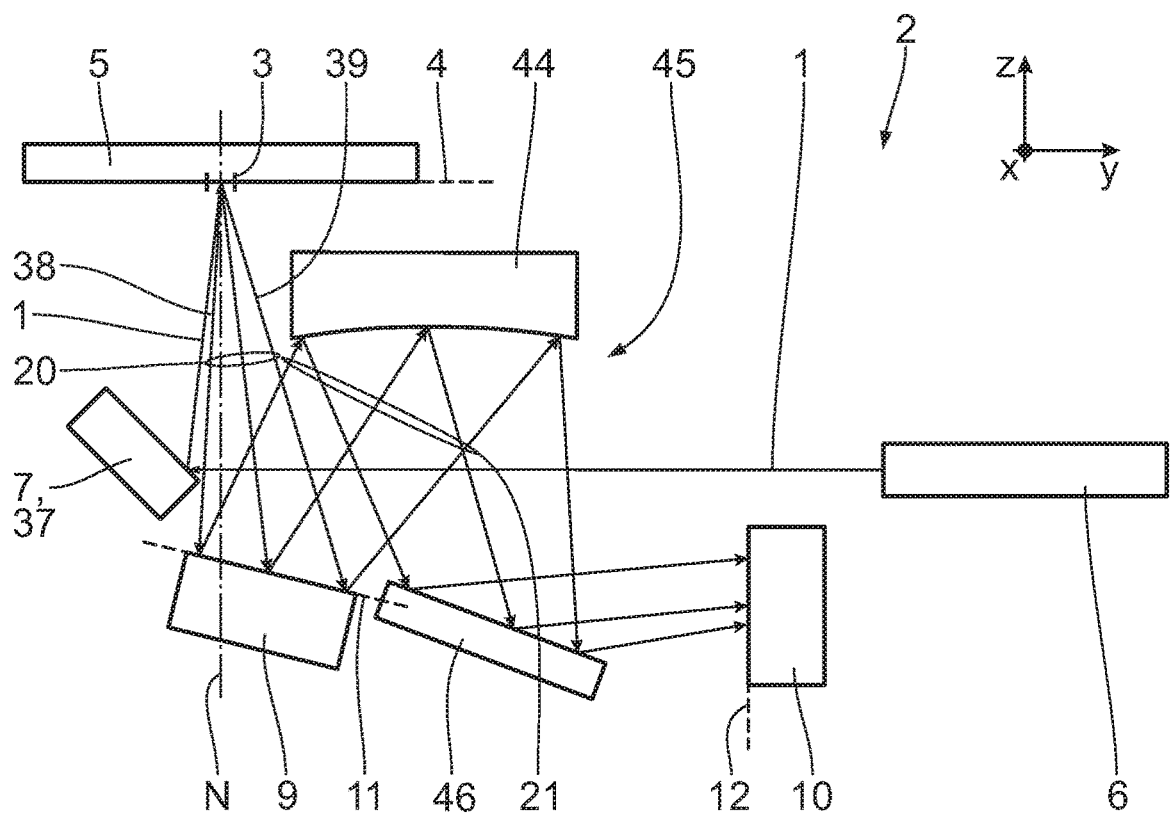

With reference to FIG. 11, a description is given below of a further embodiment of a detection device 45, which can be used instead of the detection device 8. Components and functions corresponding to those which have already been explained above with reference to FIGS. 1 to 10, and in particular with reference to FIGS. 7 to 10, bear the same reference signs and will not be discussed again in detail.

In the case of the detection device 45, the LI beam path 21, after reflection at the concave mirror 44, is also additionally reflected at a plane mirror 46. An angle of incidence on the plane mirror 46 can be in the range of 45°. In the case of an arrangement of this type, too, structural space conflicts can be avoided.

The detection plane 12 of the LI detector 10 lies parallel to the xy-plane.

Figure 12:
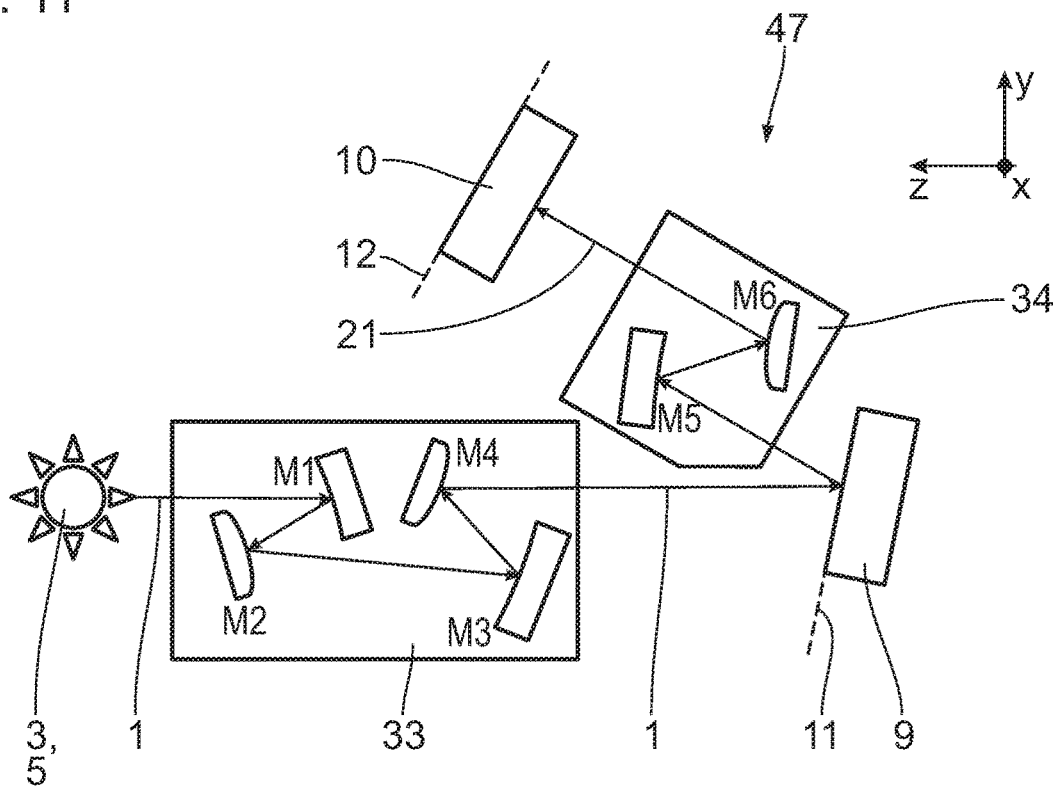

A further embodiment of a detection device 47 is described below with reference to FIG. 12. Components and functions corresponding to those which have already been explained above with reference to FIGS. 1 to 11, and in particular with reference to FIGS. 6 and 7, bear the same reference signs and will not be discussed again in detail.

The detection device 47 can be understood as a modification of the detection device 31 according to FIG. 6, wherein the HI detector 9 takes the place of the beam splitter 32 of the detection device 31, said HI detector in turn reflecting approximately 1% of the incident detection light 1 into the LI beam path 21. The imaging optical unit 33 correspondingly images the object field 3 into the HI detection plane 11 and the imaging optical unit 34 images the HI detection plane 11 into the LI detection plane 12.

Figure 13:
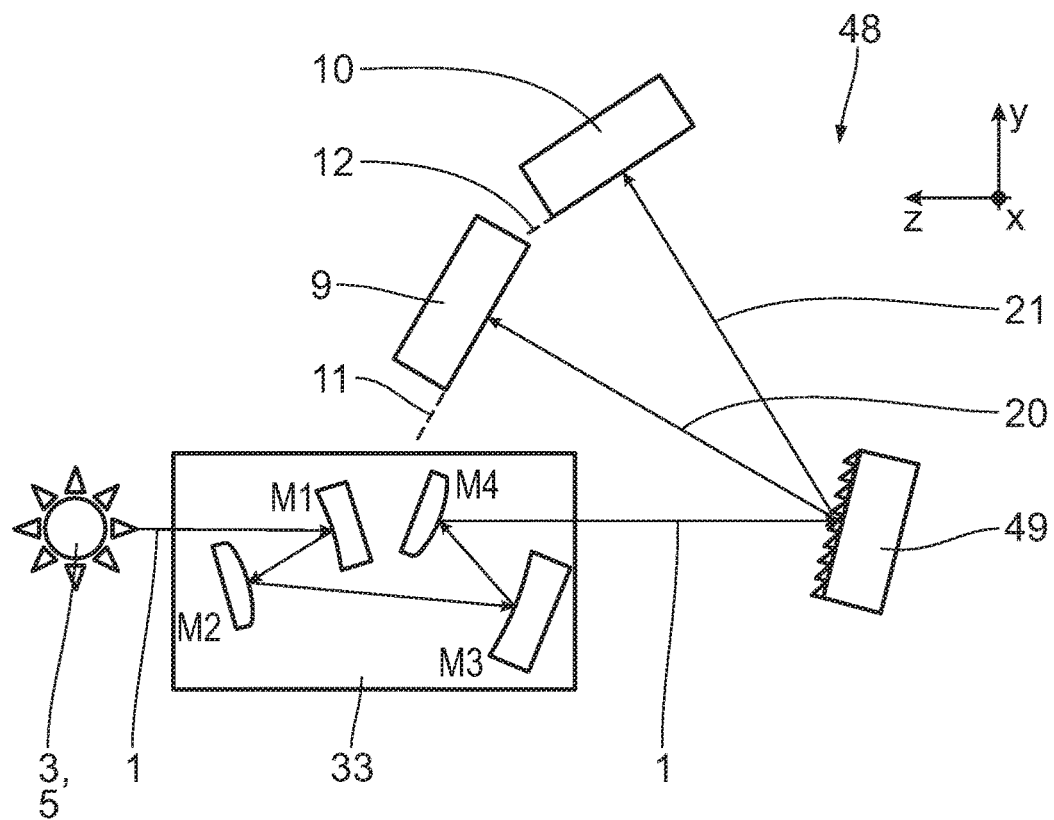

With reference to FIG. 13, a description is given below of a further embodiment of a detection device 48, which can be used instead of one of the above-explained embodiments of the detection devices in the metrology system 2 according to FIG. 1 or FIG. 7. Components and functions corresponding to those which have already been explained above with reference to FIGS. 1 to 12, and in particular with reference to FIGS. 6 and 12, bear the same reference signs and will not be discussed again in detail.

Instead of a beam splitter such as the beam splitter 32 of the detection device 31 according to FIG. 6 or the HI detector 9 in the case of the detection device 47, a diffractive structure in the form of a grating embodied as a blazed grating 49 is arranged in the detection device 48 according to FIG. 13.

The blazed grating 49 is embodied such that approximately 60% of the incident detection light 1 is diffracted into a blazed order of diffraction into the HI beam path 20. Said blazed order of diffraction can be the first or else the zero order of diffraction, depending on the embodiment of the grating 49.

Approximately 5% of the incident detection light 1 is diffracted by the blazed grating 49 into a further order of diffraction into the LI beam path 21, which can be a higher order of diffraction in comparison with the blazed order of diffraction.

The remaining approximately 35% of the intensity of the incident detection light 1 is absorbed or scattered or diffracted into other, and in particular higher, orders of diffraction by the blazed grating 49.

Figure 14:
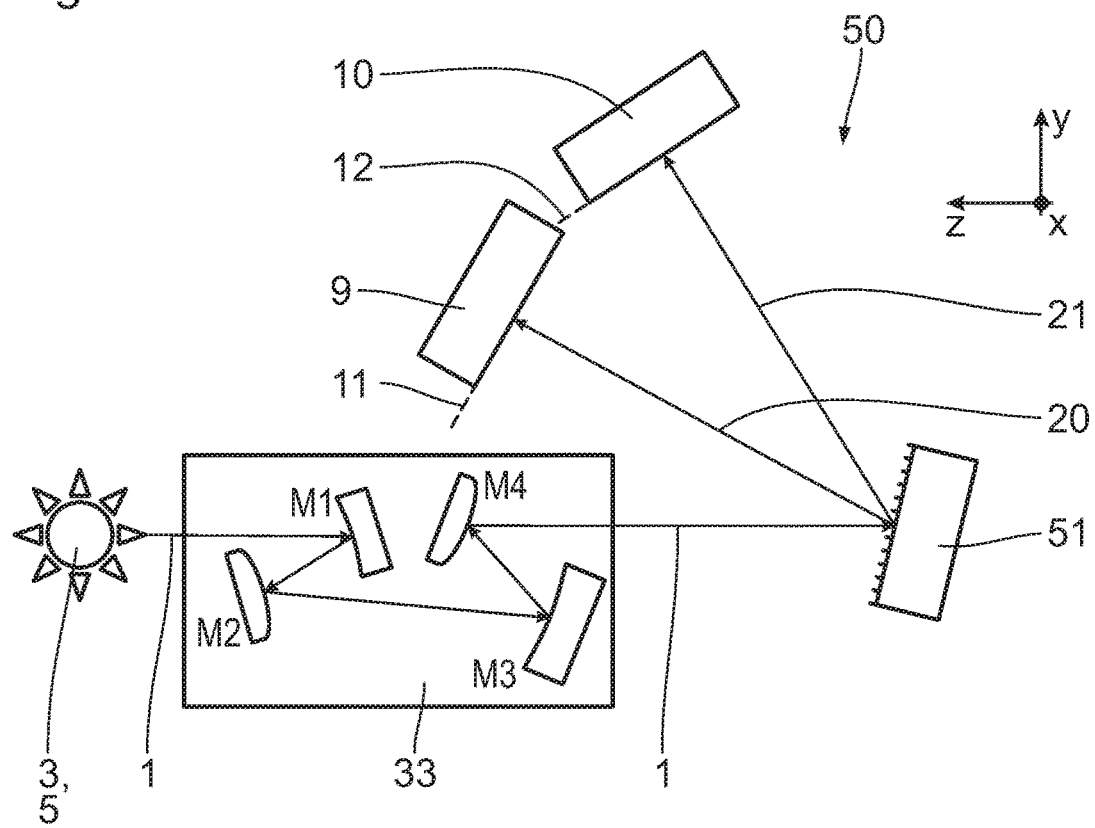

With reference to FIG. 14, a description is given below of a further embodiment of a detection device 50, which can be used instead of one of the above detection devices in the metrology systems according to FIG. 1 or FIG. 7. Components and functions corresponding to those which have already been explained above with reference to FIGS. 1 to 13, and in particular with reference to FIG. 3, bear the same reference signs and will not be discussed again in detail.

In the case of the detection device 50 according to FIG. 14, an etched grating 51 has taken the place of a blazed grating 49. Said etched grating can be produced as structuring from a substrate provided with a multilayer coating specified for EUV wavelengths. A linewidth of the etched grating 51 is chosen such that a zero order of diffraction predefines the HI beam path 20 and a +/−1st order of diffraction predefines the LI beam path 21. Relative to the intensity of the detection light 1 that is incident on the etched grating 51, approximately 60% of this intensity is allotted to the HI beam path 20 and approximately 5% to the LI beam path 21.

Figure 15:
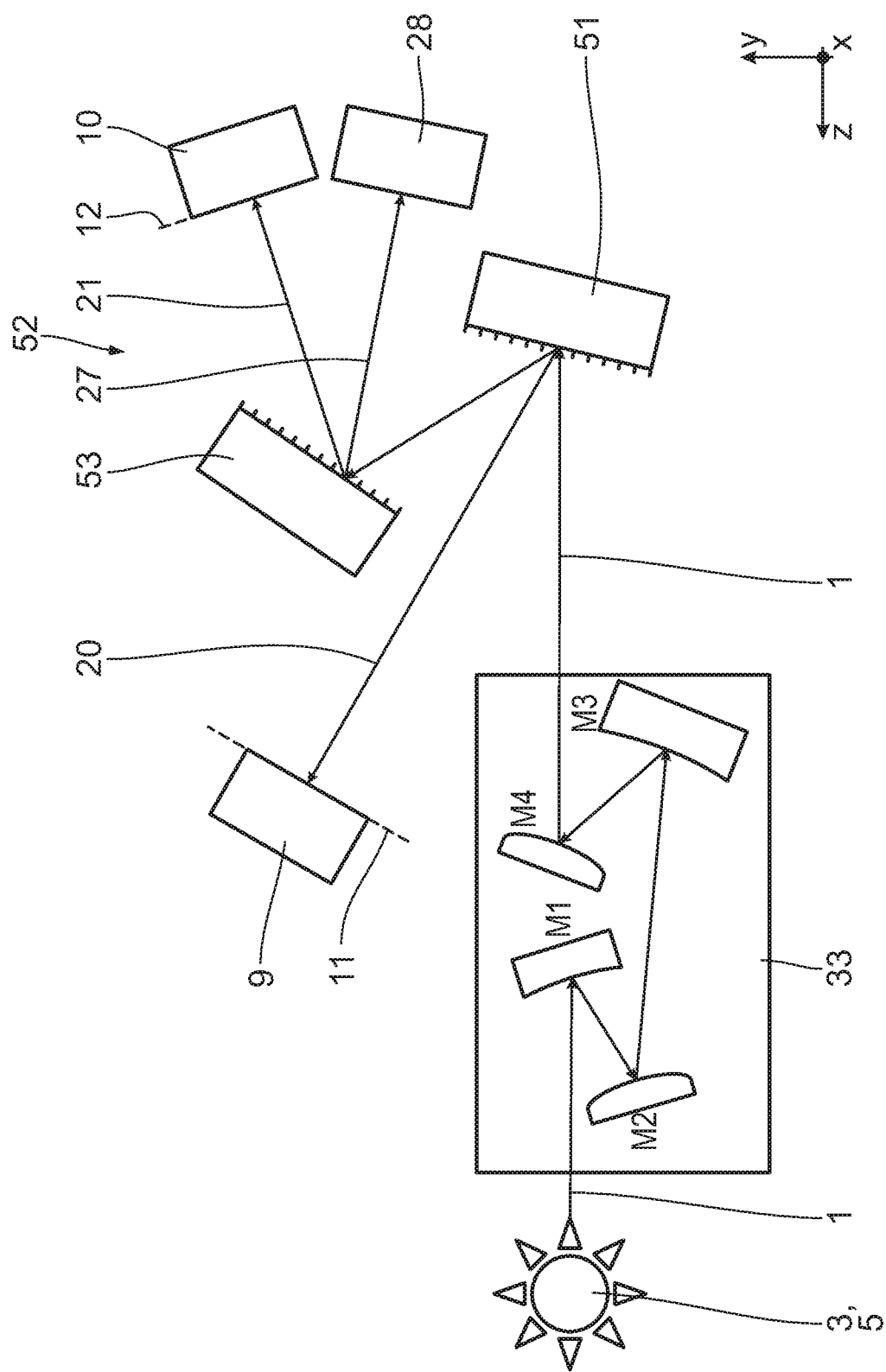

With reference to FIG. 15, a description is given below of a further embodiment of a detection device 52, which can be used instead of one of the above detection devices in the metrology systems according to FIG. 1 or FIG. 7. Components and functions corresponding to those which have already been explained above with reference to FIGS. 1 to 14, and in particular with reference to FIGS. 3, 13 and 14, bear the same reference signs and will not be discussed again in detail.

In the case of the detection device 52, which otherwise corresponds to the detection device according to FIG. 14, the beam path diffracted into the +/−1st order of diffraction by the etched grating 51 is directed onto a further grating 53 and is split there into the MI beam path 27 having approximately 5% of the detection light intensity incident on the first grating 51 and into the LI beam path 21 having approximately 0.5 of the detection light intensity incident on the first grating. As in the case of the embodiment according to FIG. 3, the MI beam path is then incident on the MI detector 28, and the LI beam path 21 is incident on the LI detector 10. In the case of the detection device 52, therefore, the two gratings 51, 53 perform the beam-splitting task of the beam splitters 25, 26 of the detection devices 24, 29 from FIGS. 3 and 4.

Figure 16:
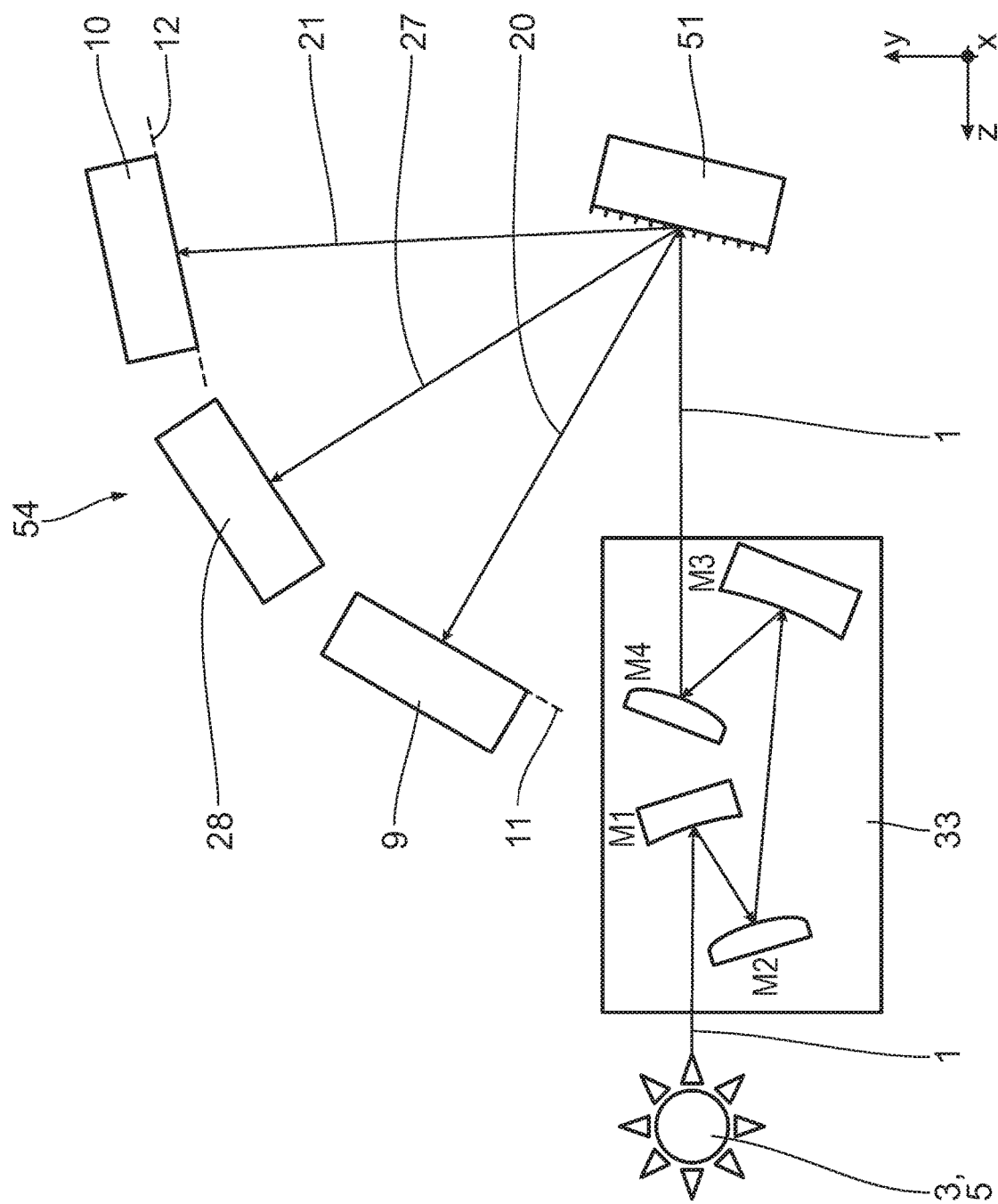

With reference to FIG. 16, a description is given below of a further embodiment of a detection device 54, which can be used instead of one of the above detection devices in the metrology systems according to FIG. 1 or FIG. 7. Components and functions corresponding to those which have already been explained above with reference to FIGS. 1 to 15, and in particular with reference to FIG. 14, bear the same reference signs and will not be discussed again in detail.

In the case of the detection device 54, the grating 51 splits the incident detection light into a plurality of orders of diffraction into the HI beam path 20 having approximately 60% of the incident detection light intensity, the MI beam path 27 having approximately 5% of the incident detection light intensity and into the LI beam path 21 having approximately 1% of the incident detection light intensity.

Figure 17:
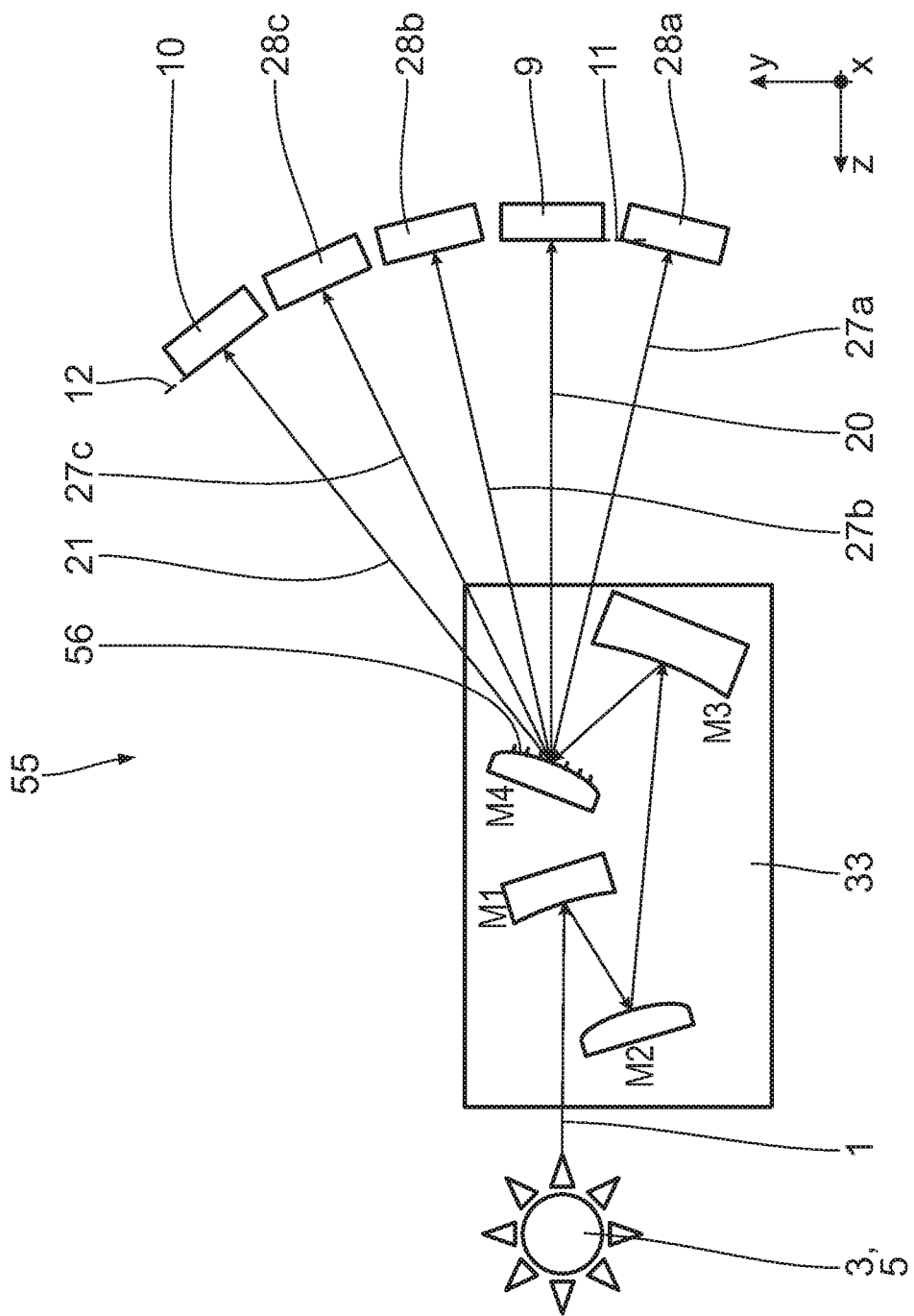

With reference to FIG. 17, a description is given below of a further embodiment of a detection device 55, which can be used instead of one of the above detection devices in the metrology systems according to FIG. 1 or FIG. 7. Components and functions corresponding to those which have already been explained above with reference to FIGS. 1 to 16, and in particular with reference to FIGS. 14 and 16, bear the same reference signs and will not be discussed again in detail.

In the case of the detection device 55 according to FIG. 17, the last mirror M4 of the imaging optical unit 33 is provided with a grating structure 56 having a splitting function similar to that of the grating 51 of the detection device 54 according to FIG. 16. The grating structure 56 splits the detection light incident on the mirror M4 into the HI beam path 20 of a zero order of diffraction, into which approximately 60% of the incident detection light intensity passes, into two MI beam paths 27a, 27b of a +/−1st order of diffraction, into each of which approximately 5% of the incident detection light intensity passes, into a further MI beam path 27c of a second order of diffraction, into which approximately 1% of the incident detection light intensity passes, and also into the LI beam path 21 of a third order of diffraction, into which approximately 0.1% of the incident detection light intensity passes.

Accordingly, besides the HI detector 9 and LI detector 10 in the HI beam path 20 and in the LI beam path 21, the detection device 55 also has three further MI detectors 28a, 28b and 28c in the three MI beam paths 27a, 27b and 27c.

A signal-to-noise ratio can be improved by way of the additional detectors.

The embodiments according to FIGS. 2 to 6 and 12 to 17 are suitable for imaging optical systems. The embodiments according to FIGS. 7 to 11 are suitable for systems in which optical imaging does not take place, for example for the detection of diffraction structures or diffraction spectra.

With the aid of these above-described embodiments of the detection devices, a method for detecting a structure of the lithography mask 5 can be carried out by use of the metrology system 2.

In a first step, a portion of the lithography mask 5, namely the portion coinciding with the object field 3, is illuminated with the illumination light 1 of the light source 6 with a defined illumination direction or a defined illumination direction distribution.

With the aid of the detection device 8, a diffraction pattern of the illuminated portion is recorded by spatially resolved detection of a diffraction intensity of the illumination light 1 diffracted by the illuminated portion of the lithography mask 5 with the HI/MI/LI detectors in the respective detection planes.

In particular, far field imaging can be effected with the aid of the optical unit 13. In order to represent the diffraction pattern, the optical unit 13 can thus generate an image of the imaging pupil. The optical unit 13 can be embodied as at least one Bertrand lens element or at least one Bertrand mirror. However, the optical unit can also simply be omitted and the far field imaging can be realized by use of a certain distance between the illuminated lithography mask and the sensor.

The illumination of the lithography mask 5 is then carried out for further portions of the lithography mask 5. For this purpose, the lithography mask 5 is displaced relative to the illumination spot of the illumination light 1 in the xy-plane, which is effected with the aid of the mask holder 14. This therefore results in a corresponding relative displacement of the object field 3 on the lithography mask 5. Adjacent illuminated portions on the lithography mask 5 overlap in each case in an overlap region. An area extent of said overlap region amounts to at least 5% of the smaller of the two illuminated portions of the lithography mask 5. If the illuminated portions, as in the case of the exemplary embodiment described, are each of the same size and have the extent of the object field 3, the overlap region amounts to at least 5% of the area of the object field 3. In variants of the structure detection method, the overlap region can amount to at least 10%, at least 20%, at least 30%, at least 40%, at least 50%, at least 60%, at least 70%, at least 80% or else at least 90% of the area of object field 3.

The reconstruction of the structure of the lithography mask 5 from the recorded diffraction patterns can be effected by use of an iterative method. This is done by firstly assuming an approximation for the structure of the lithography mask (this may be a bad approximation, e.g. a constant structure). This approximation is illuminated with the aid of a simulation in a portion and the diffraction pattern is calculated. In this case, the simulation of the illumination corresponds to the illumination actually carried out previously. In a simple case, the diffraction pattern can be calculated by use of a Fourier transformation of the approximation illuminated portion by portion. The calculated diffraction pattern consists of amplitude and phase information. The amplitude is replaced by the root of the measured diffraction pattern (of the same illuminated portion of the lithography mask) and the phase is maintained. A new estimation of the structure of the lithography mask is obtained by use of an inverse Fourier transformation (or reverse simulation).

This estimation extends over the entire area of the lithography mask 5, wherein only a portion or a portion structure of this estimation corresponds to the illuminated portion or the illuminated portion structure. It is only in this region that the initially assumed approximation for the structure of the lithography mask is updated by the newly obtained estimation in terms of amplitude and phase. This newly obtained estimation is then illuminated in a different portion and the procedure just described is repeated, with the result that gradually all measured diffraction patterns contribute to an overall approximation of the structure of the lithography mask. It is usually necessary for each illuminated portion to undergo the described procedure a number of times in an iterative method, since the overall estimation of the structure of the lithography mask still changes and the simulated diffraction patterns thus still change in terms of amplitude and phase. In the method described, the phase cannot be directly corrected by a measurement, but rather is set to the correct value only gradually.

The overall approximation consists of value pairs "amplitude/phase" for all calculated portion structures at the respective spatial coordinates x, y which are assigned to the lithography mask 5. In this case, the amplitude value corresponds to the square root of the intensity of the light in the band-limited near field of the lithography mask. In this case, the phase value corresponds to the phase of the light in the band-limited near field of the lithography mask 5. These values yield structure information of the lithography mask 5.

This scanning of the entire lithography mask 5 with illuminated portions is effected until the detected portion structures completely cover an entire region to be detected of the lithography mask 5. With the aid of a digital spatial stop, a spatial region in the space domain of the overall approximation is then selected from the overall approximation. The x, y-coordinates of this spatial region can correspond for example to those of an originally illuminated portion of the lithography mask 5.

The region selection of the overall approximation that is effected by the application of the digital spatial stop, that is to say the amplitude/phase data in the spatial region, are then Fourier-transformed, resulting in an amplitude distribution and a phase distribution in the frequency domain of the diffraction pattern.

In an adaptation step, the amplitude distribution resulting from the Fourier transformation is then replaced by the actual measurement result, that is to say by the measured amplitude distribution of the diffraction pattern. The phase distribution remains unchanged. With this new distribution pair, that is to say the diffraction pattern (amplitude distribution) and the phase distribution arising in the first iteration step, the inverse Fourier transformation is again carried out for the various illuminated portions and the spatial regions resulting therefrom. This is repeated until the overall approximation, that is to say the region to be detected of the lithography mask 5, converges, that is to say does not change by more than a predefined tolerance value. The structure of the lithography mask 5 thus resulting from the converging overall approximation is the result of the detection method.

The calculation of the object structure of the respective portion and the combination to form the overall approximation are effected using a method of coherent diffractive imaging (CDI). Such a method is known from the specialist article "High numerical aperture reflection mode coherent diffraction microscopy using off-axis apertured illumination" by D. F. Gardner et al., Optics Express, Vol. 20, No. 17, 2012.

Basic principles of the iterative Fourier transformation algorithm (IFTA) are found in the specialist article "Further improvements to the ptychographical iterative engine" by A. Maiden et al., OPTICA, Vol. 4, No. 7, 2017 and "Movable Aperture Lensless Transmission Microscopy: A Novel Phase Retrieval Algorithm" by H. M. L. Faulkner et al., for RevLett, Vol. 93, No. 2, 2004.

A further reference for the use of a diffractive image recording in structure detection is the specialist article "Full field tabletop EUV coherent diffractive imaging in a transmission geometry" by B. Zhang et al., Optics Express, Vol. 21, No. 19, 2013.

A CDI method requires a detector having an enormously high dynamic range: the camera pixels impinged on by the 0th order of diffraction see a high light intensity. If the structure or sample to be detected is at least partly periodic, the detector or camera pixels that are impinged on by the +/−1st order of diffraction of this period also see a very high intensity. Most of the other camera pixels see a significantly lower light intensity or no light intensity at all. Precisely the pixels having the low light intensity carry the essential information about the structure of the sample. Therefore, precisely these pixels must be measured with a sufficient signal-to-noise ratio. A high illumination intensity is therefore required and the pixels of the zeroth and optionally +/−1st orders of diffraction therefore obtain a very large amount of light. Therefore, a camera having a dynamic range of $10^{15}$, $10^{6}$, $10^{7}$ or even higher is required precisely for the CDI method. Such a high dynamic range can be attained using HDR technology.

The features described above related to processing of data can be implemented by, e.g., the signal processor 13*a* or an electronic data processing apparatus, or be implemented in digital electronic circuitry, or in computer hardware, firmware, software, or in combinations of them. The features related to processing of data includes, e.g., the reconstruction of the structure of the lithography mask from the recorded diffraction patterns by use of an iterative method, including Fourier transformation and inverse Fourier transformation, and the calculation of the object structure of the respective portion and the combination to form the overall approximation effected using coherent diffractive imaging. The features can be implemented in a computer program product tangibly embodied in an information carrier, e.g., in a machine-readable storage device, for execution by a programmable processor; and method steps can be performed by a programmable processor executing a program of instructions to perform functions of the described implementations by operating on input data and generating output. Alternatively or addition, the program instructions can be encoded on a propagated signal that is an artificially generated signal, e.g., a machine-generated electrical, optical, or electromagnetic signal, that is generated to encode information for transmission to suitable receiver apparatus for execution by a programmable processor.

In some implementations, the operations associated with processing of data described in this document can be performed by one or more programmable processors executing one or more computer programs to perform the functions described in this document. A computer program can be written in any form of programming language, including compiled or interpreted languages, and it can be deployed in any form, including as a stand-alone program or as a module, component, subroutine, or other unit suitable for use in a computing environment.

For example, the signal processor 13*a* can be suitable for the execution of a computer program and can include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as hard drives, magnetic disks, magneto-optical disks, or optical disks. Machine-readable storage media suitable for embodying computer program instructions and data include various forms of non-volatile storage area, including by way of example, semiconductor storage devices, e.g., EPROM, EEPROM, and flash storage devices; magnetic disks, e.g., internal hard disks or removable disks; magneto-optical disks; and CD-ROM and DVD-ROM discs.

In some implementations, the processe 1s for detecting a structure on an area portion of a lithography mask described above can be implemented using software for execution on one or more mobile computing devices, one or more local computing devices, and/or one or more remote computing devices. For instance, the software forms procedures in one or more computer programs that execute on one or more programmed or programmable computer systems, either in the mobile computing devices, local computing devices, or remote computing systems (which may be of various architectures such as distributed, client/server, or grid), each including at least one processor, at least one data storage system (including volatile and non-volatile memory and/or storage elements), at least one wired or wireless input device or port, and at least one wired or wireless output device or port.

In some implementations, the software may be provided on a medium, such as a flash memory drive, a CD-ROM, DVD-ROM, or Blu-ray disc, readable by a general or special purpose programmable computer or delivered (encoded in a propagated signal) over a network where it is executed. The functions may be performed on a special purpose computer, or using special-purpose hardware, such as coprocessors. The software may be implemented in a distributed manner in which different parts of the computation specified by the software are performed by different computers. Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

While this specification contains many specific implementation details, these should not be construed as limitations on the scope of any inventions or of what may be claimed, but rather as descriptions of features specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described above should not be understood as requiring such separation in all embodiments.

Thus, particular embodiments of the subject matter have been described. Other embodiments are within the scope of the following claims. In some cases, the actions recited in the claims can be performed in a different order and still achieve desirable results.

What is claimed is:

1. A detection device for detecting a structure on an area portion of a lithography mask,
    comprising a first spatially resolving detector, embodied as a high-intensity (HI) detector, arranged in an HI beam path of detection light which emanates from the mask area portion, and
    comprising a further spatially resolving detector, arranged separately from the first spatially resolving detector, embodied as a low-intensity (LI) detector, arranged in an LI beam path of the detection light,
    wherein the HI beam path on the one hand and the LI beam path on the other hand are embodied such that the HI detector is illuminated with a detection light intensity that is at least twice the magnitude of the detection light intensity with which the LI detector is illuminated,
    wherein the two spatially resolving detectors are embodied for simultaneously detecting the detection light, and the spatially resolving detectors are arranged such that a reflection at the HI detector is part of the LI beam path.

2. The detection device of claim 1, characterized by an arrangement in such a way that beam deflections in the HI beam path take place exclusively as a result of reflection.

3. The detection device of claim 1, wherein the HI detector has a multilayer coating.

4. The detection device of claim 1, comprising a beam splitter for splitting a detection beam path emanating from the area portion into the HI beam path and the LI beam path.

5. The detection device of claim 4, comprising an imaging optical unit for imaging the area portion, wherein the beam splitter is arranged in an image plane of the imaging optical unit.

6. The detection device of claim 4, wherein the beam splitter has a multilayer coating.

7. The detection device of claim 4, wherein the beam splitter has a diffractive structure.

8. The detection device of claim 7, wherein the beam splitter is embodied as a grating.

9. The detection device of claim 4, wherein an angle of reflection of a chief beam of the HI beam path after impinging on the beam splitter is less than 20°.

10. The detection device of claim 1, comprising at least one mirror in the LI beam path.

11. A detection device for detecting a structure on an area portion of a lithography mask,
    comprising a first spatially resolving detector, embodied as a p-polarization (pPol) detector, arranged in a pPol beam path of detection light which emanates from the mask area portion, and
    comprising a further spatially resolving detector, arranged separately from the first spatially resolving detector, embodied as an s-polarization (sPol) detector, arranged in an sPol beam path of the detection light,
    wherein the two spatially resolving detectors are embodied for simultaneously detecting the detection light.

12. An apparatus for detecting a structure on an area portion of a lithography mask, comprising:
    the detection device of claim 1,
    a light source for the detection light, and
    a mask holder for mounting the lithography mask.

13. A method for operating a detection device for detecting a structure on an area portion of a lithography mask or for operating an apparatus for detecting a structure on an area portion of a lithography mask,
    wherein the detection device comprises:
    a first spatially resolving detector, embodied as a high-intensity (HI) detector, arranged in an HI beam path of detection light which emanates from the mask area portion, and a further spatially resolving detector, arranged separately from the first spatially resolving detector embodied as a low-intensity (LI) detector, arranged in an LI beam path of the detection light, wherein the HI beam path on the one hand and the LI beam path on the other hand are embodied such that the HI detector is illuminated with a detection light intensity that is at least twice the magnitude of the detection light intensity with which the LI detector is illuminated, wherein the two spatially resolving detectors are embodied for simultaneously detecting the detection light, and the spatially resolving detectors are arranged such that a reflection at the HI detector is part of the LI beam path, wherein the apparatus comprises:

the detection device, a light source for the detection light, and a mask holder for mounting the lithography mask, wherein the method comprises the following steps:

recording images by simultaneously detecting the detection light by use of the detectors of the apparatus, and combining the recorded images to form an overall image.

14. The method of claim 13, wherein the combined overall image has an increased dynamic range in comparison with the individual images recorded.

15. The device of claim 11, comprising a diffractive structure that transmits s-polarized light to the s-polarization detector and reflects p-polarized light towards the p-polarization detector.

16. The apparatus of claim 12 in which the detection device is configured in such a way that beam deflections in the HI beam path take place exclusively as a result of reflection.

17. The method of claim 13 in which the detection device is configured in such a way that beam deflections in the HI beam path take place exclusively as a result of reflection.

18. The method of claim 13 in which combining the recorded images to form an overall image comprises coherent diffractive imaging.

19. The method of claim 13 in which combining the recorded images to form an overall image comprises iterative Fourier transformation.

20. The detection device of claim 1, comprising:

a second spatially resolving detector, arranged separately from the first spatially resolving detector, embodied as a medium-intensity (MI) detector, wherein the HI detector is illuminated with a detection light intensity that is greater than the detection light intensity with which the MI detector is illuminated, and the MI detector is illuminated with a detection light intensity that is greater than the detection light intensity with which the LI detector is illuminated, and wherein the three spatially resolving detectors are embodied for simultaneously detecting the detection light.

* * * * *